United States Patent
Nagase

(10) Patent No.: US 12,181,609 B2
(45) Date of Patent: Dec. 31, 2024

(54) DISTANCE MEASURING DEVICE, CAMERA, AND METHOD FOR ADJUSTING DRIVE OF DISTANCE MEASURING DEVICE

(71) Applicant: TOPPAN Holdings Inc., Tokyo (JP)

(72) Inventor: Masanori Nagase, Hamamatsu (JP)

(73) Assignee: TOPPAN Holdings Inc., Tokyo (JP)

( * ) Notice: Subject to any disclaimer, the term of this patent is extended or adjusted under 35 U.S.C. 154(b) by 926 days.

(21) Appl. No.: 17/228,689

(22) Filed: Apr. 12, 2021

(65) Prior Publication Data

US 2021/0255286 A1 Aug. 19, 2021

Related U.S. Application Data

(63) Continuation of application No. PCT/JP2019/038221, filed on Sep. 27, 2019.

(30) Foreign Application Priority Data

Oct. 16, 2018 (JP) .................................. 2018-195018

(51) Int. Cl.
*G01S 7/4863* (2020.01)
*G01S 7/4865* (2020.01)
(Continued)

(52) U.S. Cl.
CPC .......... *G01S 7/4863* (2013.01); *G01S 7/4865* (2013.01); *G01S 17/18* (2020.01); *G01S 17/89* (2013.01); *H04N 25/75* (2023.01); *H04N 25/76* (2023.01)

(58) Field of Classification Search
CPC ...... G01S 7/4863; G01S 7/4865; G01S 17/18; G01S 17/89; G01S 7/4816; G01S 7/4876;
(Continued)

(56) References Cited

U.S. PATENT DOCUMENTS 5,486,711 A * 1/1996 Ishida ............... H01L 27/14679
257/292
7,781,811 B2 8/2010 Kawahito et al.
(Continued)

FOREIGN PATENT DOCUMENTS

CN 112639513 A 4/2021
DE 4305011 A1 8/1994
(Continued)

OTHER PUBLICATIONS

Extended European Search Report for Application No. 19872289.4, issued on Jun. 8, 2022, 11 pages.

*Primary Examiner* — Thanh Luu
*Assistant Examiner* — Monica T Taba
(74) *Attorney, Agent, or Firm* — Polsinelli PC

(57) ABSTRACT

A range-measuring device encompasses N charge-distributing gates configured to distribute the signal charges toward N charge-transfer routes, a charge-exhausting gate for exhausting unwanted charges other than the signal charges, N charge-accumulation regions for accumulating the signal charges, a driver for transmitting drive signals to the N charge-distributing gates and the charge-exhausting gate, a readout-amplifier for reading out output signals corresponding to the signal charges accumulated in the N charge-accumulation regions, an arithmetic logic circuit configured to execute a job for calculating ranges to the target after receiving the output signals transmitted through the readout-amplifier.

18 Claims, 22 Drawing Sheets

(51) Int. Cl.
*G01S 17/18* (2020.01)
*G01S 17/89* (2020.01)
*H04N 25/75* (2023.01)
*H04N 25/76* (2023.01)

(58) Field of Classification Search
CPC ....... G01S 7/497; G01S 17/894; H04N 25/75; H04N 25/76; H04N 23/60; H04N 25/531; G01C 3/08; H01L 27/14609
See application file for complete search history.

(56) References Cited

U.S. PATENT DOCUMENTS

| | | |
|---|---|---|
| 2006/0192938 A1 | 8/2006 | Kawahito |
| 2009/0134396 A1 | 5/2009 | Kawahito et al. |
| 2010/0290028 A1 | 11/2010 | Tachino et al. |
| 2011/0134298 A1* | 6/2011 | Aoyama ................ H04N 25/77 257/431 |
| 2017/0052065 A1 | 2/2017 | Sharma et al. |
| 2017/0171485 A1* | 6/2017 | Kawahito ........... H01L 27/1461 |
| 2017/0234983 A1* | 8/2017 | Mase .................... H04N 25/745 356/5.01 |
| 2018/0045513 A1* | 2/2018 | Kitamura ................ G01S 17/10 |
| 2018/0156899 A1 | 6/2018 | Yamada et al. |
| 2019/0206915 A1* | 7/2019 | Kawahito ......... H01L 27/14616 |
| 2019/0391266 A1* | 12/2019 | Mori ........................ G02B 7/32 |
| 2021/0270968 A1 | 9/2021 | Nagase |

FOREIGN PATENT DOCUMENTS

| | | |
|---|---|---|
| EP | 3819664 A1 | 5/2021 |
| JP | 2010-267720 A | 11/2010 |
| JP | 2015-49148 A | 3/2016 |
| JP | 2016-45066 A | 9/2017 |
| WO | WO 2007/026779 A1 | 3/2007 |
| WO | 2008152647 A2 | 12/2008 |
| WO | 2008152647 A3 | 12/2008 |
| WO | WO 2017/022219 A1 | 2/2017 |
| WO | WO 2020/080065 A1 | 4/2020 |

\* cited by examiner

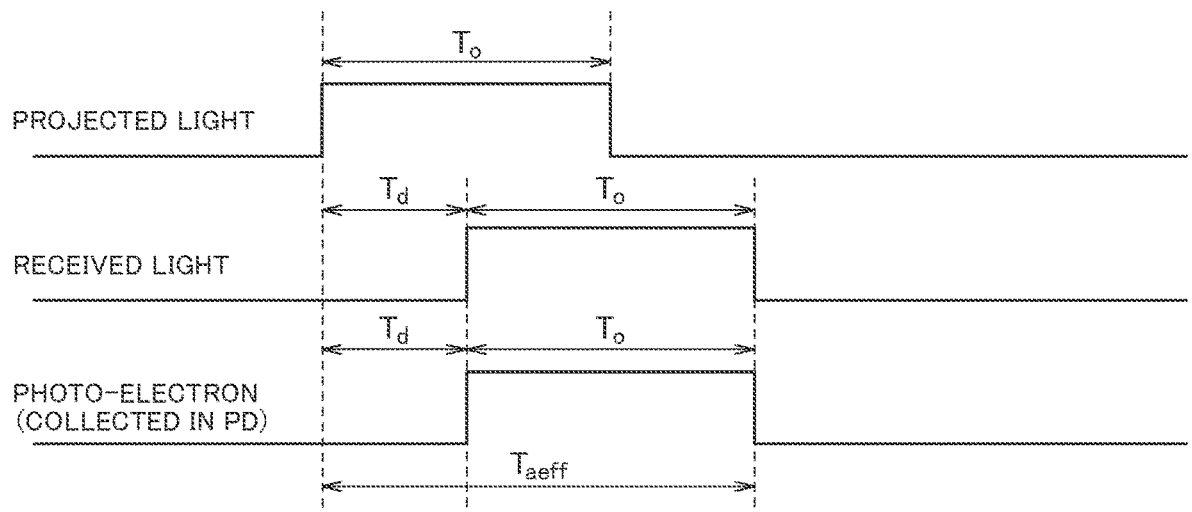
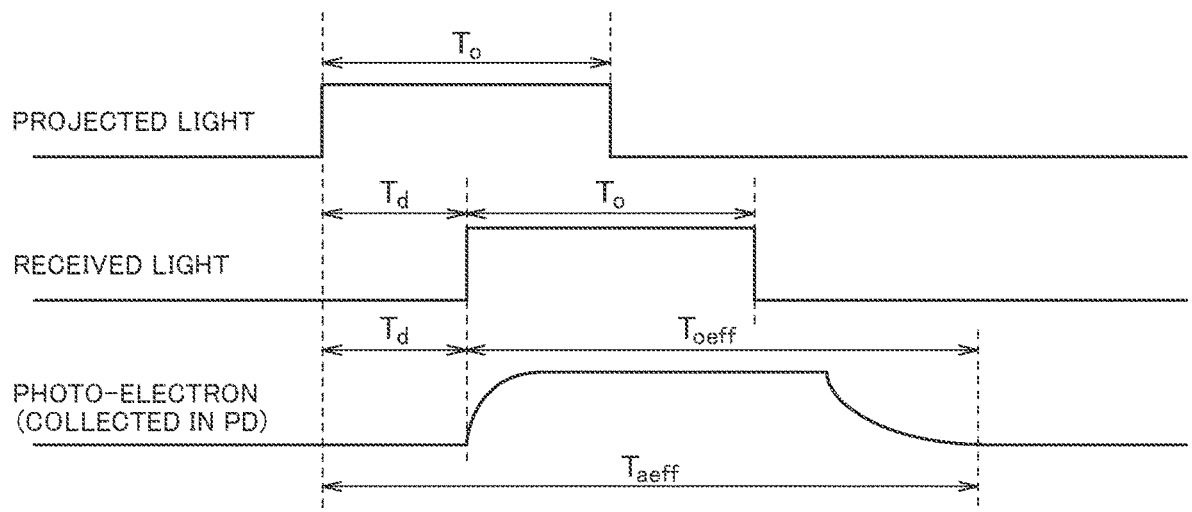

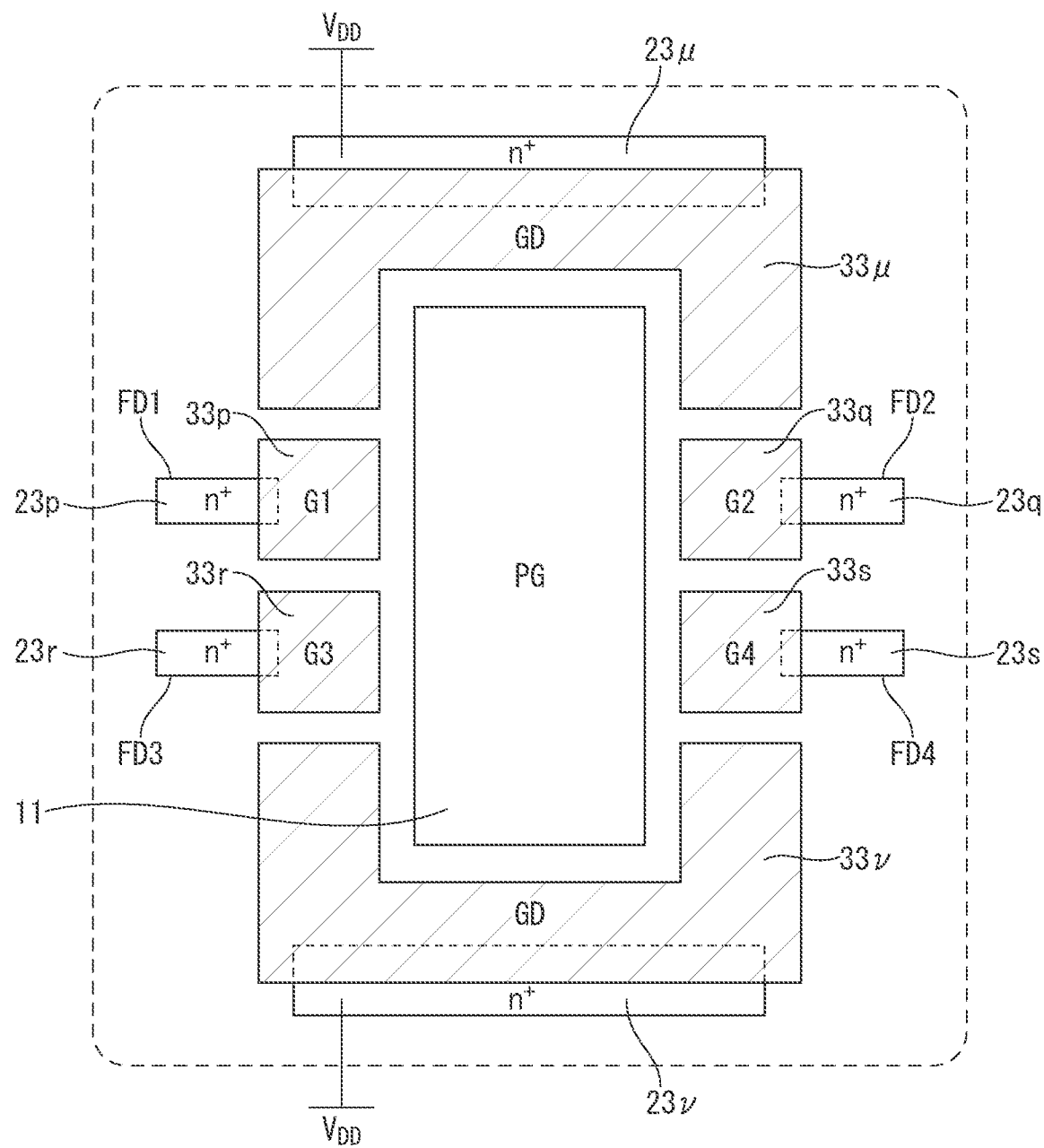

DISTANCE MEASURING DEVICE, CAMERA, AND METHOD FOR ADJUSTING DRIVE OF DISTANCE MEASURING DEVICE

REFERENCE

This application is a continuation of International Application PCT/JP2019/038221, with an international filing date of Sep. 27, 2019, which claims benefit of priority under 35 USC 119 based on Japanese Patent Application No. 2018-195018 filed Oct. 16, 2018, the entire contents of each application are incorporated by reference herein.

BACKGROUND OF THE INVENTION

1. Field of the Invention

The present invention relates to range-measuring elements and range-measuring devices (range measurement devices) of three-dimensional (3D) imaging devices or the like. And more particularly, the present invention pertains to a CMOS image sensor (CIS) or a range-measuring device using pixels in the CIS, a camera including the range-measuring device, and a method for adjusting the drive of the range-measuring device.

2. Description of the Related Art

In recent years, the developments of 3D imaging elements using solid-state imaging elements have been actively carried out. Even in the 3D imaging elements, although earlier CCD imaging sensors acted as mainstream, at present, the CISs are becoming to act as mainstream.

Among various 3D imaging architectures, time-of-flight (TOF) scheme is high in range precision, wide in measurable range span and relatively easy in range calculation. In the TOF 3D imaging element, mainly, there are a continuous wave (CW) modulation scheme and an optical pulse synchronous scheme. Both of the CW and optical pulse schemes are implemented by a plurality of charge-distributing gates, which are incorporated in optical detectors such as photodiodes (PDs) or the like. Then, lock-in drives are carried out in which the plurality of charge-distributing gates are repeatedly turned on/off.

In general, for removing unwanted charges generated by environmental lights, or background lights, the TOF 3D imaging elements use infrared lights as optical signals. And furthermore, in order to remove the unwanted charges generated by environmental light, the TOF 3D imaging elements uses band pass filters and the like for cutting off the lights other than the optical signal as much as possible, in general. However, it is very difficult to remove all of the influences by environmental lights. A triple-branched lock-in pixel, which is referred to as "a triple-taps lock-in pixel", has triple charge-distributing gates for distributing charges. In the triple-branched lock-in pixel, a first gate among triple charge-distributing gates is assigned to the gate for dedicatedly removing the environment lights. Since environmental light removal-performance is high, the triple-branched lock-in pixel is suitable for use in an environment in which the influence of the environmental lights is great, such as outdoor, bright indoor and the like.

However, in the earlier triple-branched lock-in pixel, charge-accumulation periods per single event in triple-branched route, or the charge-accumulation periods are all set to the same time length as recited in WO 2007/026779A1. Namely, in WO 2007/026779A1, time lengths from a previous gate-off to a next gate-off are all set to the same length. Due to the above situation in the charge-accumulation periods, there is a problem that the linearity in longer-distance image is deteriorated, and an extent of measurable range becomes to be narrowed.

A dashed line in FIG. 10 illustrates an investigated result, in which relations between actual ranges from an imaging element to subjects (targets) and the corresponding data of estimated ranges is investigated, the data of estimated ranges are measured by the scheme of the invention described in WO 2007/026779A1. The alignment of data, which are measured by the earlier triple-branched lock-in pixel, is understood to be deviated from a linear relation of the solid line, over the data point in which the actual ranges become larger than about three meters.

SUMMARY OF THE INVENTION

A first aspect of the present invention inheres in a range-measuring device encompassing (a) a light emitter for projecting pulsed lights to a target, (b) a light-receiving region for receiving reflected pulsed lights from the target, configured to photo-electrically convert the received pulsed lights into signal charges in the light-receiving region, (c) a set of N charge-distributing gates, configured to distribute the signal charges toward N charge-transfer routes, in sequence, so that the signal charges can transport along the N charge-transfer routes, respectively, wherein "N" is a positive integer of three or more, (d) a charge-exhausting gate for exhausting unwanted charges other than the signal charges from the light-receiving region, the unwanted charges are generated in the light-receiving region, (e) N charge-accumulation regions for accumulating the signal charges transported along the N charge-distributing gates, respectively, (f) a driver for transmitting a sequential set of control signals to the light emitter and transmitting drive signals in sequence to each of the N charge-distributing gates and the charge-exhausting gate at sequential timings differing from each other so as to provide offset times in between the sequential set of the drive signals, (g) a readout-amplifier for independently reading out output signals corresponding to each of the signal charges accumulated in the N charge-accumulation regions, respectively, and (h) an arithmetic logic circuit configured to execute a job for calculating ranges to the target, after receiving the output signals transmitted through the readout-amplifier.

A second aspect of the present invention inheres in a camera encompassing (p) an imaging-optical tool, (q) a light emitter for projecting pulsed lights to a target, (r) a solid-state imaging device merging a light-receiving region for receiving reflected pulsed lights from the target through the imaging-optical tool, configured to photo-electrically convert the received pulsed lights into signal charges in the light-receiving region, a set of N charge-distributing gates configured to distribute the signal charges toward N charge-transfer routes, in sequence, so that the signal charges can transport along the N charge-transfer routes, respectively, wherein "N" is a positive integer of three or more, a charge-exhausting gate for exhausting unwanted charges other than the signal charges from the light-receiving region, the unwanted charges are generated in the light-receiving region, N charge-accumulation regions for accumulating the signal charges transported along the N charge-distributing gates, respectively, a driver for transmitting a sequential set of control signals to the light emitter and transmitting drive signals in sequence to each of the N charge-distributing gates and the charge-exhausting gate at sequential timings differing from each other so as to provide offset times in between the sequential set of the drive signals, and a readout-amplifier for independently reading out output signals corresponding to each of the signal charges accumulated in the N charge-accumulation regions, respectively, and(s) an arithmetic logic circuit configured to execute a job for calculating ranges to the target, after receiving the output signals transmitted through the readout-amplifier.

A third aspect of the present invention inheres in a drive-adjusting method of a range-measuring device prescribed by the first aspect. Namely, the drive-adjusting method pertaining to the third aspect of the present invention includes (u) executing a job for calculating ranges to the target, after receiving the signals transmitted through the readout-amplifier, and (v) generating sequential set of the drive signals, configured to be transmitted to each of the N charge-distributing gates and the charge-exhausting gate, at sequential timings differing from each other so as to provide offset times in between the sequential set of the drive signals.

BRIEF DESCRIPTION OF THE DRAWINGS

FIG. 12A is an ideal waveform illustrating a transient response in the range-measuring device of the comparative example;

FIG. 12B is an actual waveform illustrating the transient response in the range-measuring device of the comparative example;

FIG. 25 is a plan view of a main portion of a pixel in a range-measuring device pertaining to a fifth embodiment;

DETAILED DESCRIPTION OF THE INVENTION

Figure 1:
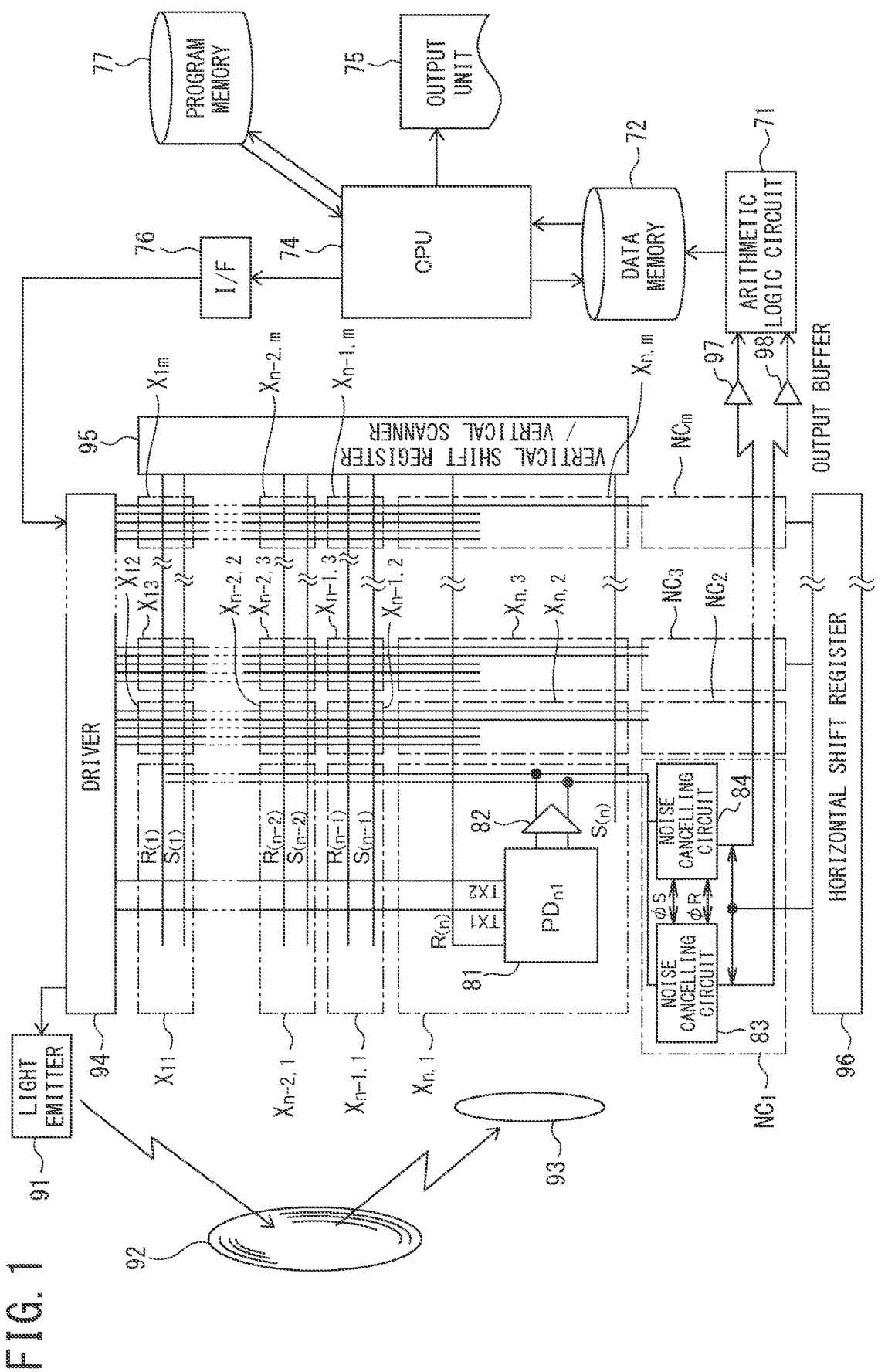
FIG. 1 is a schematic block diagram explaining an outline of one example of a main portion of a range-measuring device pertaining to a first embodiment of the present invention.

Hereinafter, first to sixth embodiments of the present invention will be described with reference to the Drawings. Note that, in the following description of the Drawings, the same or similar reference numerals denote the same or similar elements and portions. However, because the drawing is merely diagrammatic, attention should be paid to a fact that a relationship between a thickness and a planar dimension, a ratio between thicknesses of respective layers and the like differ from actual values. Hence, the concrete thicknesses and dimensions should be judged by referring to the following explanations. Also, it is natural that a portion in which the mutual dimensional relations and ratios differ from each other are included even between the mutual drawings.

In addition, it should be noted that the following first to sixth embodiments each illustrate a device or method embodying the technical ideas of the present invention. The technical ideas of the present invention are not intended to be limited to the following configurations or arrangement of circuit elements and circuit blocks, or alternatively, are not intended to be limited to the following layout on the semiconductor chips described below. Various modifications will be apparent to those skilled in the art within the technical ideas of the present invention.

Also, in the following explanations of the first to sixth embodiments of the present invention, a case when a first conductivity type is "a p-type" and a second conductivity type is "an n-type" is exemplified. However, by inversely selecting the conductivity type, the first conductivity type may be "the n-type", and the second conductivity type may be "the p-type". It is apparent to those skilled in the art that, when the conductivity type is inversely assigned, "the high-level" and "the low-level" in pulsed waveforms shall be appropriately inversely elected, if necessary.

For example, in the explanation of the following FIG. 1, a range-measuring device based upon 3D imaging device in which a plurality of pixels (range-measuring elements) is deployed in a pixel-array area so as to implement a two-dimensional (2D) matrix, for the sake of convenience, and such explanations do not limit the technical ideas of the present invention. For example, from the content of the above disclosure, it will be easily understood that, in an architecture for the two-dimensional matrix illustrated in FIG. 1, a plurality of the pixels can be arrayed one-dimensionally to implement a line sensor. Furthermore, a range sensor having a simple structure, in which only a single range-measuring element is disposed in the pixel-array area, may be included in the technical scope of the present invention.

First Embodiment

As illustrated in FIG. 1, the feature of the range-measuring device pertaining to the first embodiment of the present invention lies in a 2D arrayed image sensor (3D imaging device) in which pixel-array area ($X_{11}$ to $X_{1m}$; $X_{21}$ to $X_{2m}$; - - -; $X_{n1}$ to $X_{nm}$) and peripheral-circuit area (71, 72, 74 to 77, 94 to 96, and NC1 to NCm) are merged on the same semiconductor chip. In the pixel-array area ($X_{11}$ to $X_{1m}$; $X_{21}$ to $X_{2m}$; - - -; $X_{n1}$ to $X_{nm}$), many pixels $X_{ij}$ (i=1 to m; j=1 to n:m and n are positive integers of two or more, respectively) are arrayed in shape of 2D matrix and implement a rectangular imaging area.

And, a driver 94 is arranged in an upper side of the pixel-array area ($X_{11}$ to $X_{1m}$; $X_{21}$ to $X_{2m}$; - - -; $X_{n1}$ to $X_{nm}$), and a horizontal shift register 96 is arranged in a lower side of the pixel-array area, and each of the driver 94 and the horizontal shift register 96 is arranged along pixel rows $X_{11}$ to $X_{1m}$; $X_{21}$ to $X_{2m}$; - - -; $X_{n1}$ to $X_{nm}$ directions. Then, in a right side of the pixel-array area, a vertical shift register and vertical scanner 95 are arranged along pixel columns $X_{11}$ to $X_{n1}$; $X_{12}$ to $X_{n2}$; - - -; $X_{ij}$ to $X_{nj}$; - - -; $X_{1m}$ to $X_{nm}$ directions. To the driver 94, a light emitter 91 for projecting lights as repetitive-pulsed signals, which are required for each pixel $X_{ij}$ to carry out range measurements as the range-measuring element, is connected.

To the driver 94, control signals for controlling the driver 94 are transmitted through an interface 76 from a control processor (CPU) 74. To the control processor 74, a program memory 77 for storing a program to instruct a series of operations in the control processor 74, and a data memory 72 for storing data, thresholds and others, which are necessary for logical calculations in the control processor 74, are connected. To the control processor 74, an output unit 75 is further connected for delivering results of the logical calculations in the control processor 74. To the data memory 72, an arithmetic logic circuit 71 is connected for receiving output signals from the pixel-array area ($X_{11}$ to $X_{1m}$; $X_{21}$ to $X_{2m}$; - - -; $X_{n1}$ to $X_{nm}$) through output buffers 97 and 98 and performing the operations including a calculation of a range to a target, which is required to generate a range image. By the way, although FIG. 1 schematically exemplifies an inner structure as a block diagram in the pixel $X_{n1}$, each pixel $X_{ij}$ includes a signal generator 81, which has a photoelectric-conversion element and a signal-charge transfer-element, and a source-follower readout-amplifier 82 and the like. The arithmetic logic circuit 71 performs a calculating process such as a calculation of an estimated range L between a target 92 illustrated in FIG. 1 and the pixel-array area ($X_{11}$ to $X_{1m}$; $X_{21}$ to $X_{2m}$; - - -; $X_{n1}$ to $X_{nm}$) by using Eq. (5) as described later, in addition to a job for calculating outputs for dark condition, from signals measured at immediately preceding timing.

The pixels $X_{ij}$ within the pixel-array area are sequentially scanned by the driver 94, the horizontal shift register 96 and the vertical shift register and vertical scanner 95, thereby the readout operations of pixel signals and electronic-shutter operations are performed. That is, in the range-measuring device pertaining to the first embodiment of the present invention, after the pixel-array area are scanned vertically at respective pixel rows $X_{11}$ to $X_{1m}$; $X_{21}$ to $X_{2m}$; - - -; $X_{n1}$ to $X_{nm}$ in units, the pixel signals of the respective pixel rows $X_{11}$ to $X_{1m}$; $X_{21}$ to $X_{2m}$; - - - $X_{n1}$ to $X_{nm}$ are read out by vertical-output signal-lines assigned to the respective pixel columns $X_{11}$ to $X_{n1}$; $X_{12}$ to $X_{n2}$; - - -; $X_{ij}$ to $X_{nj}$; - - -; $X_{1m}$ to $X_{nm}$. By the way, FIG. 1 illustrates the structure in which the arithmetic logic circuit 71, the interface 76, the control processor 74, the program memory 77, the data memory 72 and the output unit 75 are merged in the same semiconductor chip. However, the structure illustrated in FIG. 1 is mere exemplification. The structure of the range-measuring device pertaining to the first embodiment is not limited to the topology and layout illustrated in FIG. 1. Thus, other configurations are allowed in which at least partial circuits and other elements of the range calculator 71, the interface 76, the control processor 74, the program memory 77, the data memory 72 and the output unit 75 are assigned to different chips or substrates.

The signal readout operations from the respective pixels $X_{11}$ to $X_{1m}$; $X_{21}$ to $X_{2m}$; - - - ; $X_{n1}$ to $X_{nm}$ as the range-measuring elements are approximately similar to a known normal CMOS image sensor. However, a first drive signal $G_1$, a second drive signal $G_2$ and a third drive signal $G_3$, which are intended to transfer the signal charges from the respective photodiodes of the respective pixels $X_{11}$ to $X_{1m}$; $X_{21}$ to $X_{2m}$; - - - ; $X_{n1}$ to $X_{nm}$, are applied to all of the pixels $X_{11}$ to $X_{1m}$; $X_{21}$ to $X_{2m}$; - - - ; $X_{n1}$ to $X_{nm}$ from the driver 94 at the same time. Moreover, since the drive signals $G_1$, $G_2$ and $G_3$ are the signals of high frequencies, switching noise is generated in the signal-readout periods. Thus, the signal readout operations from the pixel units are performed by preparing the signal-readout period after the completion of processes by noise processors NC1 to NCm.

Figure 2:
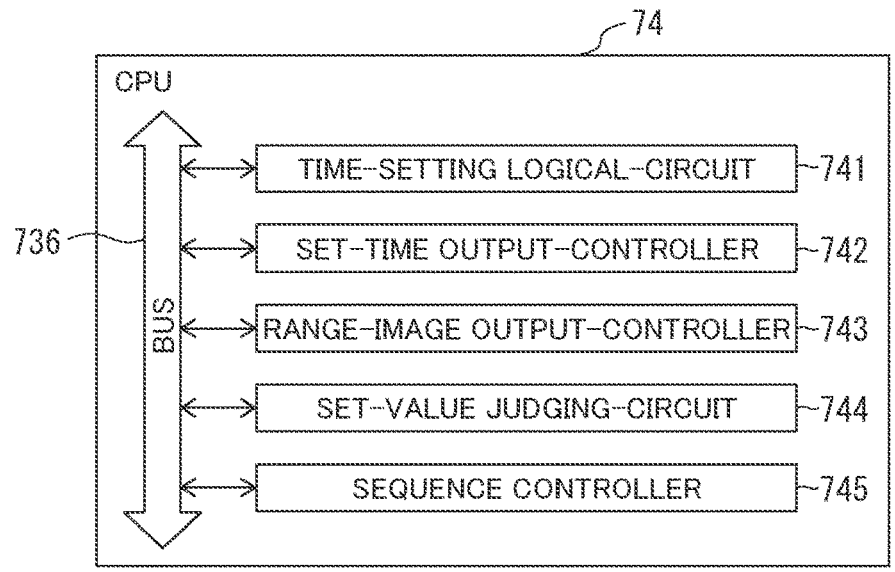
FIG. 2 is a logical block-diagram explaining an inner structure of a control processor embedded in a peripheral circuit of the range-measuring device pertaining to the first embodiment as hardware resources.
Figure 6:
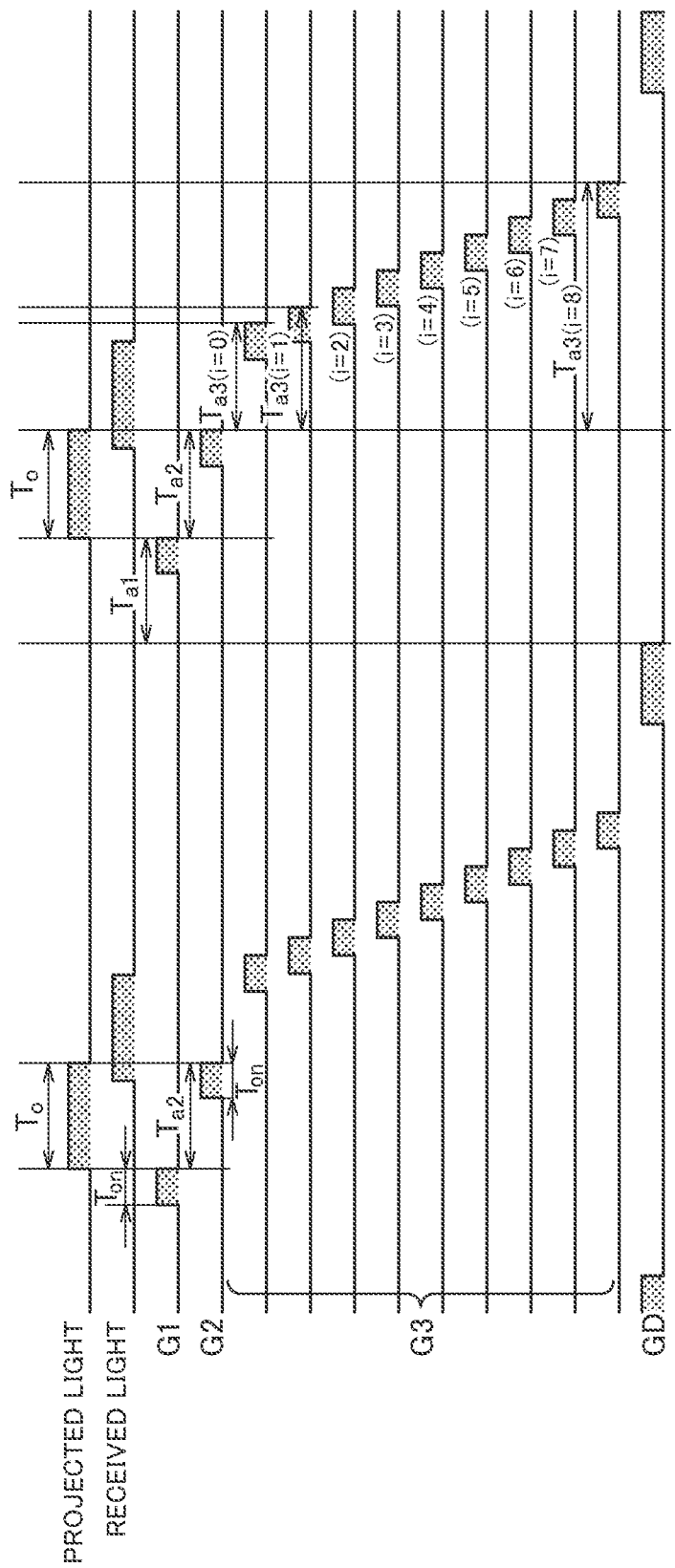
FIG. 6 is a drive-timing chart explaining an operation of the range-measuring device pertaining to the first embodiment, when the drive of the range-measuring device is adjusted.

As logically illustrated in FIG. 2, the control processor 74 includes a time-setting logical-circuit 741, a set-time output-controller 742, a range-image output-controller 743, a set-value judging-circuit 744 and a sequence controller 745, as hardware resources. The time-setting logical-circuit 741 sets the values of a light-projection period $T_o$, a first charge-accumulation period $T_{a1}$, a second charge-accumulation period $T_{a2}$ and a third charge-accumulation period $T_{a3}$ and others, as illustrated in FIG. 6 which will be described later. Or, the time-setting logical-circuit 741 is a logical circuit for properly modifying the values of the light-projection period $T_o$, the first charge-accumulation period $T_{a1}$, the second charge-accumulation period $T_{a2}$ and the third charge-accumulation period $T_{a3}$ and others, as illustrated in FIG. 6 which will be described later, in response to output signals of the set-value judging-circuit 744. Then, the time-setting logical-circuit 741 performs specific time settings so that the first drive signal $G_1$, the second drive signal $G_2$ and the third drive signal $G_3$, which are applied to transferring gates, have timings differing from each other. Namely, the time-setting logical-circuit 741 provides offset times in between the first drive signal $G_1$ and the second drive signal $G_2$, or in between the second drive signal $G_2$ and the third drive signal $G_3$, as illustrated in FIG. 6.

The set-time output-controller 742 is a logical circuit for delivering a repetitive-cycle period $T_c$, the light-projection period $T_o$, the first charge-accumulation period $T_{a1}$, the second charge-accumulation period $T_{a2}$, the third charge-accumulation period $T_{a3}$ and a charge-transfer period $T_{on}$ and others, which are set or modified by the time-setting logical-circuit 741, as control signals through the interface 76 to the driver 94.

The range-image output-controller 743 is a logical circuit for synthesizing the detected values of ranges, which are calculated by the arithmetic logic circuit 71, as the data of the range images, if the set-value judging-circuit 744 judges the detected values of ranges as "Yes". And, the range-image output-controller 743 delivers the data of the range images to the output unit 75.

The set-value judging-circuit 744 is a logical circuit for judging whether or not a difference between an output for dark condition, which is measured and calculated by the arithmetic logic circuit 71 at an immediately preceding timing, and an output for dark condition, which is measured and calculated at a further one cycle preceding timing from the immediately preceding timing, is lower than a threshold, which is pre-stored in the data memory 72. Or alternatively, the set-value judging-circuit 744 judges whether or not a difference between the detected value of a range, which is measured and calculated at the immediately preceding timing, and the detected value of the range, which is measured and calculated at the further one cycle preceding timing from the immediately preceding timing, is lower than the threshold. And the set-value judging-circuit 744 delivers the judged result to the time-setting logical-circuit 741 or the range-image output-controller 743.

The sequence controller 745 is a logical circuit for sequentially controlling the respective operations of the time-setting logical-circuit 741, the set-time output-controller 742, the range-image output-controller 743, the set-value judging-circuit 744, the interface 76, the program memory 77 and the data memory 72, on the basis of a clock signal. The time-setting logical-circuit 741, the set-time output-controller 742, the range-image output-controller 743, the set-value judging-circuit 744 and the sequence controller 745 can transmit and receive information between each other through a bus 736.

As illustrated in a block diagram on the right side of FIG. 1, in a portion corresponding to an organization of a computer system including CPU 74, the data memory 72 can be organized by any combination of components that are properly selected from a group including a plurality of registers, a plurality of cache memories, a main memory and a secondary memory. Also, a cache memory may be organized by a combination of a primary cache memory and a secondary cache memory, or may have a hierarchy further including a tertiary cache memory. Although illustration is omitted, in a case that the data memory 72 includes a plurality of registers, the end of the bus 736 may be extended to the interface 76, the program memory 77 and the data memory 72 and others.

The control processor 74 illustrated in FIG. 2 can implement a computer system, by using microprocessors (MPUs) assembled as microchips and others. Also, as the control processor 74 implementing the computer system, a digital signal processor (DSP), which has an enhanced function of arithmetic calculation and is specialized and dedicated in signal processing, can be used. Furthermore, a micro controller, which includes memories and peripheral circuits, configured to control embedded devices can be used as the control processor 74. Or, a main CPU in a current general-purpose computer system may be used for the control processor 74.

Moreover, a partial configuration or whole configuration of the control processor 74 may be implemented by a programmable logical device (PLD) such as a field programmable gate array (FPGA). In a case that the part or whole of the control processor 74 is implemented by the PLD, the data memory 72 can embrace memory components such as memory blocks embedded in a part of logical blocks implementing the PLD. Moreover, the control processor 74 may be structured by a configuration, in which a plurality of arrays like CPU-cores and programmable cores like PLDs are merged in the same chip. Here, the arrays like CPU-cores may include hard macro-CPUs and soft macro-CPUs. The hard macro-CPUs are pre-embedded in the PLD, and the soft macro-CPUs are implemented by the logical blocks of the PLD. In short, a configuration, in which a software process and a hardware process are mixed inside the PLD, can be used as the part or whole of the control processor 74.

Figure 3:
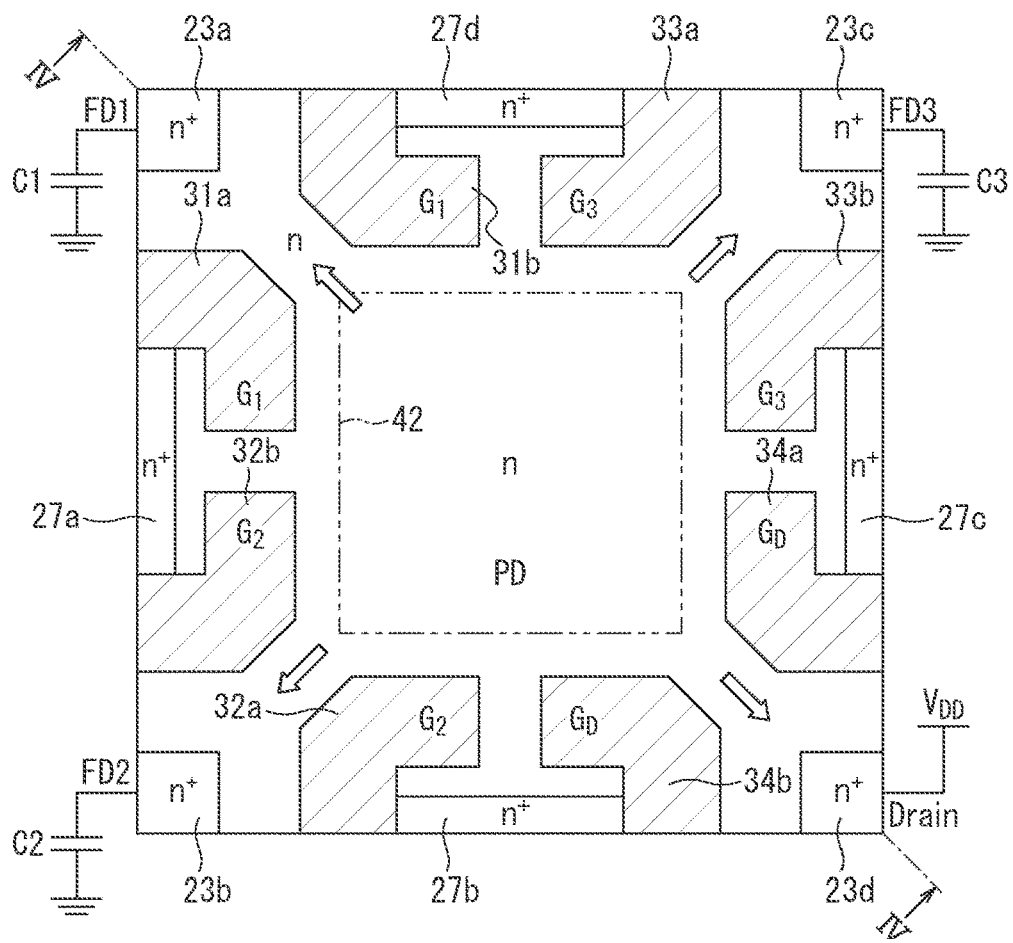
FIG. 3 is a plan view explaining an outline of a structure of a triple-branched pixel in the range-measuring device pertaining to the first embodiment.
Figure 4:
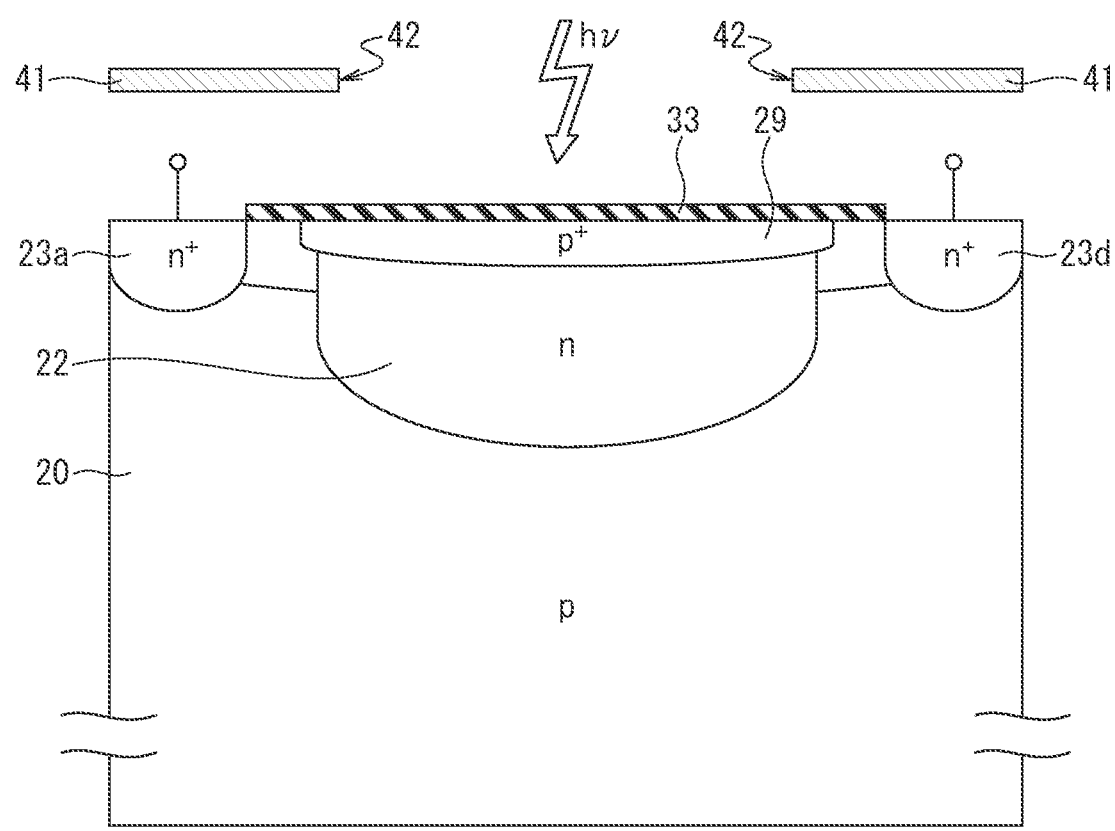
FIG. 4 is a cross-sectional view taken from an IV-IV direction in FIG. 3.

FIG. 3 illustrates one example of planar structures serving as signal generators 81 in each of the pixels $X_{11}$ to $X_{1m}$; $X_{21}$ to $X_{2m}$; - - - ; $X_{n1}$ to $X_{nm}$ in the range-measuring device pertaining to the first embodiment. Also, FIG. 4 illustrates one example of cross-sectional structures, corresponding to the planar structure illustrated in FIG. 3. FIG. 4 is a cross-sectional view taken from the IV-IV direction in the layout view in FIG. 3. $T_o$ a buried photodiode that is optically shielded except an opening 42, a first charge-distributing gate (31a, 31b), a second charge-distributing gate (32a, 32b) and a third charge-distributing gate (33a, 33b), which transfer the signal charges photo-electrically converted in the light-receiving region in the buried photodiode, and a charge-exhausting gate (34a, 34b) are connected as electric field control (EFC) electrode pairs.

The first charge-distributing gate (31a, 31b), the second charge-distributing gate (32a, 32b), the third charge-distributing gate (33a, 33b) and the charge-exhausting gate (34a, 34b) are arranged on a gate insulating-film 33 as EFC electrode pairs. Each of the first charge-distributing gate (31a, 31b), the second charge-distributing gate (32a, 32b), the third charge-distributing gate (33a, 33b) and the charge-exhausting gate (34a, 34b) forms a pair on both sides of charge-transfer routes. The charge-transfer routes diagonally extend, from the central position of the light-receiving region, towards each of a first charge-accumulation region 23a, a second charge-accumulation region 23b, a third charge-accumulation region 23c and a charge-exhaust region 23d, which are disposed at positions surrounding the light-receiving region. Lights, which are projected (irradiated) as repetitive-pulsed signals from a light emitter 91 in FIG. 1, are reflected by a target 92 and incident on the light-receiving region through the opening 42 in a light shielding film 41 covering the periphery of the light-receiving region in FIG. 3. That is, the light-receiving region of a photoelectric-conversion element receives pulsed lights incident through the opening 42 in the light shielding film 41 as optical signals and converts the optical signals into signal charges and distributes the signal charges to triple directions of the first charge-distributing gate (31a, 31b), the second charge-distributing gate (32a, 32b) and the third charge-distributing gate (33a, 33b).

As illustrated in the plan view of FIG. 3 and the cross-sectional view of FIG. 4, a portion serving as the signal generator 81 within the pixel in the range-measuring device pertaining to the first embodiment encompasses a functional-substrate layer 20 made of p-type semiconductor, a photoelectric-conversion region (29, 22) including a p$^+$ type pinning layer 29 formed in contact with an upper surface of an n-type surface-buried region 22, and a gate insulating-film 33 laminated on the photoelectric-conversion region (29, 22). The surface-buried region 22 is buried in a part of the upper portion of the functional-substrate layer 20. And, the center of the photoelectric-conversion region (29, 22) is defined as the light-receiving region. As illustrated in the plan view of FIG. 3, the first charge-accumulation region 23a, the second charge-accumulation region 23b, the third charge-accumulation region 23c and the charge-exhaust region 23d are arranged at quadruple positions symmetric with respect to the central position of the light-receiving region. The first charge-accumulation region 23a, the second charge-accumulation region 23b, the third charge-accumulation region 23c and the charge-exhaust region 23d are arranged separately from each other so as to surround the light-receiving region. The conductivity type of the first charge-accumulation region 23a, the second charge-accumulation region 23b, the third charge-accumulation region 23c and the charge-exhaust region 23d is n$^+$ type, respectively, and each of the first charge-accumulation region 23a, the second charge-accumulation region 23b, the third charge-accumulation region 23c and the charge-exhaust region 23d has a higher impurity concentration than the functional-substrate layer 20.

The first charge-distributing gate (31a, 31b) of the photoelectric-conversion element, which implements each of the pixels, encompasses a hook-shaped first static induction (SI) electrode 31a and a hook-shaped second SI electrode 31b, in a shape of islands. The first SI electrode 31a and the second SI electrode 31b are arranged opposite to each other so as to establish an electrode pair, or the EFC electrode pair. And the EFC electrode pair sandwiches a charge-transfer route extending along a diagonal direction in between the first SI electrode 31a and the second SI electrode 31b. In a condition in which a predetermined driving voltage is applied to the first SI electrode 31a, a height of a potential barrier against the signal charges in the charge-transfer route extending along the diagonal direction towards an upper-left direction is lowered. Namely, the application of the predetermined driving voltage to the first SI electrode 31a can achieve a potential distribution for facilitating a conductive state of the charge-transfer route by a lateral electric field charge modulation (LEFM) operation. Even in a condition in which a predetermined driving voltage is applied to the second SI electrode 31b, the height of the potential barrier against the signal charges in the charge-transfer route extending along the diagonal direction is lowered, which can achieve the potential distribution for facilitating the conductive state of the charge-transfer route.

The second charge-distributing gate (32a, 32b) serves as an electrode pair in which a hook-shaped third SI electrode 32a and a hook-shaped fourth SI electrode 32b are arranged opposite to each other in the shape of islands, while sandwiching a charge-transfer route extending along a diagonal direction toward a lower-left direction in between the third SI electrode 32a and the fourth SI electrode 32b. The third charge-distributing gate (33a, 33b) serves as an electrode pair in which a hook-shaped fifth SI electrode 33a and a hook-shaped sixth SI electrode 33b are arranged opposite to each other in the shape of islands, while sandwiching the charge-transfer route extending along a diagonal direction toward an upper-right direction in between the fifth SI electrode 33a and the sixth SI electrode 33b. The charge exhausting gate (34a, 34b) serves as an electrode pair in which a hook-shaped seventh SI electrode 34a and a hook-shaped eighth SI electrode 34b are arranged opposite to each other in the shape of islands, while sandwiching a charge-transfer route extending along a diagonal direction toward a lower-right portion between the seventh SI electrode 34a and the eighth SI electrode 34b.

As can be understood from the plan view in FIG. 3, the arrangement topology of the first charge-accumulation region 23a, the second charge-accumulation region 23b, the third charge-accumulation region 23c and the charge-exhaust region 23d is rotationally symmetric four times with respect to the central position of the light-receiving region. Moreover, as illustrated in FIG. 3, in the pixel in the range-measuring device pertaining to the first embodiment, n-type charge-exhaust assist-regions 27a, 27b, 27c and 27d, each of which having higher impurity concentration than the functional-substrate layer 20, are buried separately from each other, in the peripheral portion surrounding the light-receiving region.

The first SI electrode 31a and the second SI electrode 31b are arranged opposite to each other, in mirror image relationship, on both sides of the charge-transfer route towards the first charge-accumulation region 23a. The third SI electrode 32a and the fourth SI electrode 32b are arranged opposite to each other, in the mirror image relationship, on both sides of the charge-transfer route towards the second charge-accumulation region 23b. The fifth SI electrode 33a and the sixth SI electrode 33b are arranged opposite to each other, in the mirror image relationship, on both sides of the charge-transfer route towards the third charge-accumulation region 23c. The seventh SI electrode 34a and the eighth SI electrode 34b are arranged opposite to each other, in the mirror image relationship, on both sides of the charge-transfer route towards the charge-exhaust region 23d.

According to the pixel in the range-measuring device pertaining to the first embodiment, as illustrated in FIG. 6, the first drive signal $G_1$, the second drive signal $G_2$, the third drive signal $G_3$ and an exhausting drive signal GD are cyclically applied as EFC pulses to the first charge-distributing gate (31a, 31b), the second charge-distributing gate (32a, 32b), the third charge-distributing gate (33a, 33b) and the charge exhausting gate (34a, 34b), each of which implements the EFC electrode pair. Then, depletion potential of the surface-buried region 22 is alternately changed. Accordingly, a potential gradient towards a direction in which charges are transported is alternately generated in any of the charge-transfer routes. Accordingly, transport destinations of the signal charges, which are generated and collected in the surface-buried region 22, are controlled to be sequentially set to any of the first charge-accumulation region 23a, the second charge-accumulation region 23b, the third charge-accumulation region 23c and the charge-exhaust region 23d.

Also, as illustrated in FIG. 3, the charge-exhaust assist-regions 27a, 27b, 27c and 27d are buried in peripheral portions. In a condition that each of the potential levels of the first drive signal $G_1$, the second drive signal $G_2$, the third drive signal $G_3$ and the exhausting drive signal GD is a first potential level, and the first potential level is used for defining the charge-transfer routes, respectively, a charge-exhausting pulse of a second potential level higher than the first potential level is applied to the first charge-distributing gate (31a, 31b). Thus, unwanted charges becoming noise current components against the range-measurement operation can be evacuated to the first charge-exhaust assist-region 27a and the fourth charge-exhaust assist-region 27d, the noise current components are generated by background lights, or environmental lights, and the like.

Similarly, since the charge-exhausting pulse of the second potential level is applied to the second charge-distributing gate (32a, 32b), the charges becoming the noise current components against the range-measurement operation can be evacuated to the second charge-exhaust assist-region 27b and the first charge-exhaust assist-region 27a. Also, since the charge-exhausting pulse of the second potential level is applied to the third charge-distributing gate (33a, 33b), the charges becoming the noise current components against the range-measurement operation can be evacuated to the third charge-exhaust assist-region 27c and the fourth charge-exhaust assist-region 27d. Moreover, since the charge-exhausting pulse of the second potential level is applied to the charge-exhausting gate (34a, 34b), the charges becoming the noise current components against the range-measurement operation can be evacuated to the second charge-exhaust assist-region 27b and the third charge-exhaust assist-region 27c. For example, when the voltage of each of the first drive signal $G_1$, the second drive signal $G_2$, the third drive signal $G_3$ and the exhausting drive signal $G_D$ is defined as two volts, the voltage of the second potential level for the charge-exhausting pulse may be set to about five volts.

According to the pixel in the range-measuring device pertaining to the first embodiment, the charge-transfer routes are set to implement an X-shape in which the charge-transfer routes cross each other at the center of the light-receiving region. In a direction across each charge-transfer route, by the first charge-distributing gate (31a, 31b), the second charge-distributing gate (32a, 32b), the third charge-distributing gate (33a, 33b) and the charge-exhausting gate (34a, 34b) each of which performs LEFM operation with the static induction (SI) effect, photoelectrons generated in the light-receiving region can be transferred at high speed by the LEFM operation, in the quadruple directions of the X-shape, along the charge-transfer routes implementing the X-shape. Accordingly, it is possible to perform charge modulation.

Firstly, consider a case that the electrons generated in the light-receiving region are transferred in the upper-left direction in FIG. 3 along the charge-transfer route exhibiting the X-shape, in accordance with the pixel in the range-measuring device pertaining to the first embodiment. For transporting the electrons generated in the light-receiving region towards the upper-left direction in FIG. 3 along the charge-transfer route through the center of the first charge-distributing gate (31a, 31b), each of the second charge-distributing gate (32a, 32b), the third charge-distributing gate (33a, 33b) and the charge-exhausting gate (34a, 34b) shall be biased to zero (ground potential: GND), and then, a first EFC pulse of the first drive signal $G_1$=two volts shall be applied to the first charge-distributing gate (31a, 31b) so that a potential gradient can be generated along the diagonal direction towards an upper-left direction, from the surface-buried region 22 to the first charge-accumulation region 23a.

Next, consider a reverse case that the electrons generated in the light-receiving region are scheduled to be transported towards the lower-right direction in FIG. 3 along the charge-transfer route exhibiting the X-shape. For transporting the electrons generated in the light-receiving region towards the lower-right direction through the center of the charge-exhausting gate (34a, 34b), each of the first charge-distributing gate (31a, 31b), the second charge-distributing gate (32a, 32b) and the third charge-distributing gate (33a, 33b) shall be biased to zero (ground potential GND) and then, a pulse of the exhausting drive signal $G_D$=two volts shall be applied to the charge-exhausting gate (34a, 34b) so that a potential gradient towards a lower-right direction can be generated.

Figure 5:
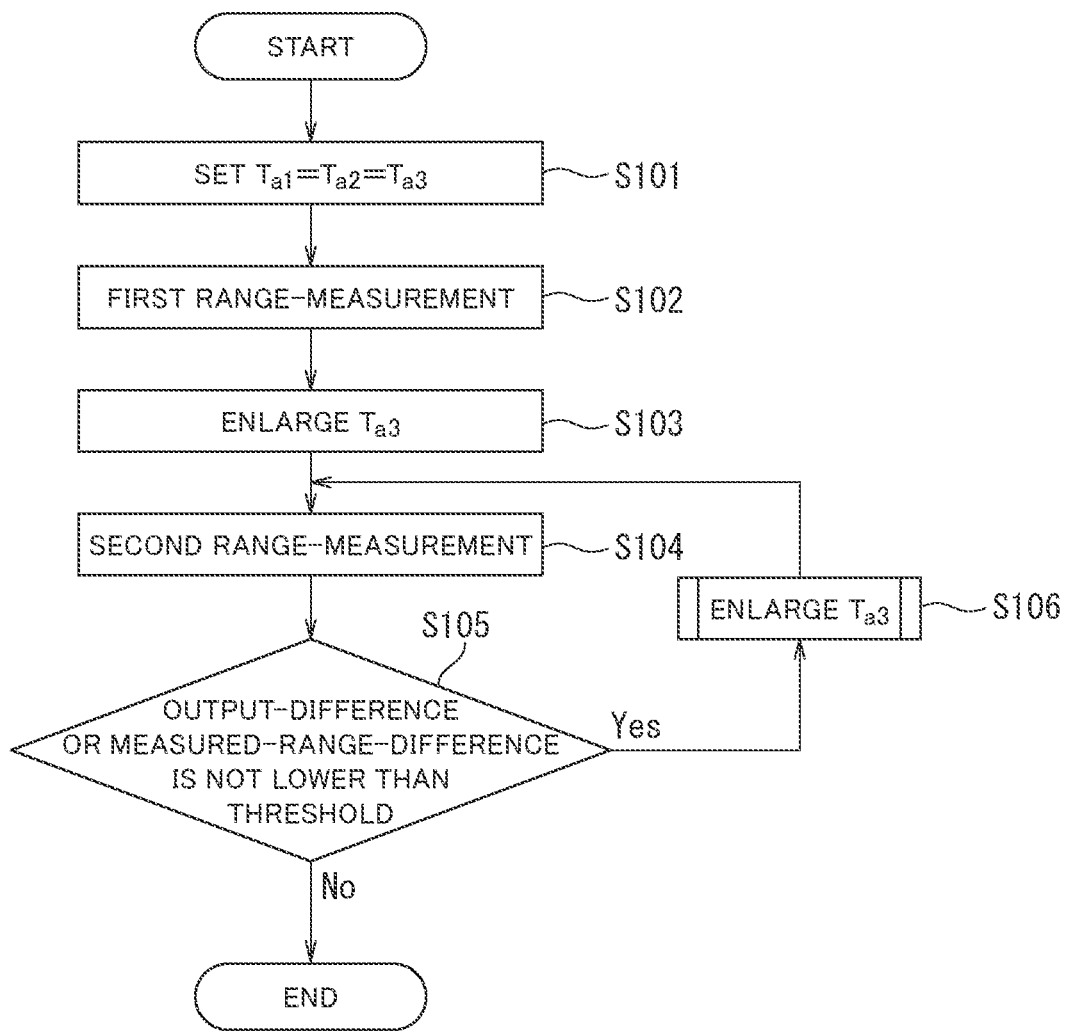
FIG. 5 is a flowchart explaining an outline of a flow of an adjusting operation by the peripheral circuit of the range-measuring device pertaining to the first embodiment, focusing to the operation of the control processor illustrated in FIG. 1.
Figure 7:
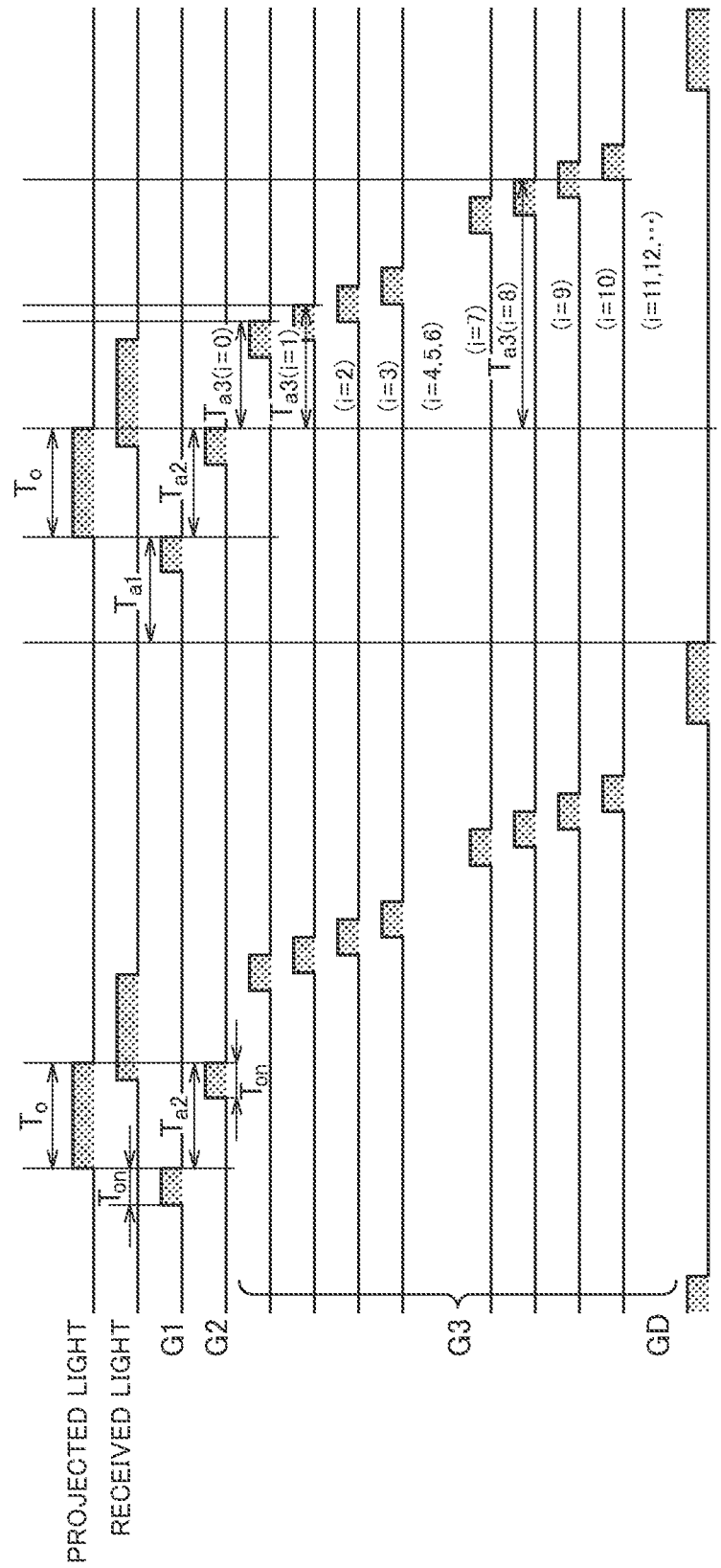
FIG. 7 is another drive-timing chart explaining the operation of the range-measuring device pertaining to the first embodiment, when the drive of the range-measuring device is adjusted.

FIG. 5 is a flowchart illustrating an outline of the operations associated with the control processor 74 according to the range-measuring device pertaining to the first embodiment illustrated in FIG. 1. FIGS. 6 and 7 are the views exemplifying the drive-timing charts in which a driving method of the range-measuring device is modified, in accordance with a program along the flow of the flowchart illustrated in FIG. 5.

FIG. 6 is the drive-timing chart explaining the operation of the range-measuring device pertaining to the first embodiment, when the drive of the range-measuring device is adjusted. On/off cycles of the pulses of the first drive signal $G_1$ applied to the first charge-distributing gate (31a, 31b), the second drive signal $G_2$ applied to the second charge-distributing gate (32a, 32b) and the third drive signal $G_3$ applied to the third charge-distributing gate (33a, 33b) are set to be equal to each other, at an initial state (i=0). The respective on/off periods are changed from each other on the basis of values of a first charge-accumulation period $T_{a1}$, a second charge-accumulation period $T_{a2}$ and a third charge-accumulation period $T_{a3}$. An on-time of the exhausting drive signal $G_D$ applied to the charge-exhausting gate (34a, 34b)

is longer than the pulse widths of the first drive signal $G_1$, the second drive signal $G_2$ and the third drive signal $G_3$. A time interval in which the waves of the exhausting drive signal $G_D$ is turned on/off is a repetitive cycle period ($T_c$).

As illustrated in FIG. 6, projected lights are synchronous with the second charge-accumulation periods $T_{a2}$ assigned to the pulse widths of the second drive signals $G_2$ in view of the timing of the first drive signals $G_1$. Range measurement is carried out in specific time domains, in which received lights are scheduled to be obtained between the second charge-accumulation period $T_{a2}$ assigned to the pulse widths of the second drive signals $G_2$ and the third charge-accumulation periods $T_{a3}$ assigned to the pulse widths of the third drive signals $G_3$. The exhausting drive signals $G_D$ are the pulsed signals applied to the charge-exhausting gate (34a, 34b) for exhausting unrequired photoelectrons, so that the received lights on and after the third charge-accumulation periods $T_{a3}$ assigned to the pulse widths of the third drive signals $G_3$ do not become noise components against the range measurement. The first drive signals $G_1$ are voltage pulses for removing or eliminating unwanted charges ascribable to background lights, or environmental lights, or alternatively, the voltage pulses for removing unwanted dark currents and others. And, for the first drive signals $G_1$, first charge-accumulation periods $T_{a1}$ are assigned, the duration of each of the first charge-accumulation periods $T_{a1}$ is defined as a time interval after the instance at the trailing edge of the pulse of the exhausting drive signals $G_D$.

That is, in the range-measuring photoelectric-conversion element that has a triple-direction distributing structure as illustrated in FIG. 3, the value of true signal charges $Q2_{real(a)}$ to be accumulated in the charge-accumulation region 23b is given by Eq. (1), in the drive-timing chart illustrated in FIG. 6.

$$Q2_{real(a)} = Q2 - Q1 \qquad (1)$$

Here, Q1 is the value of signal charges that are transported through the first charge-distributing gate (31a, 31b) and transferred to and accumulated in the charge-accumulation region 23a, Q2 is the value of signal charges that are transported through the second charge-distributing gate (32a, 32b) and transferred to and accumulated in the charge-accumulation region 23b and Q3 is the value of signal charges that are transported through the third charge-distributing gate (33a, 33b) and transferred to and accumulated in the charge-accumulation region 23c.

Also, the value of true signal charges $Q3_{real(a)}$ to be accumulated in the charge-accumulation region 23c is given by Eq. (2).

$$Q3_{real(a)} = Q3 - Q1_{alpha-ef.} \qquad (2)$$

Here, $Q1_{alpha-ef.}$ is the value of effective signal charges that are transferred to and accumulated in the charge-accumulation region 23a. When a is defined as a coefficient indicating an augmentation rate of the third charge-accumulation periods $T_{a3}$ assigned to the pulse widths of the third drive signals $G_3$ in view of the timing of the first drive signals $G_1$, the value of effective signal charges $Q1_{alpha-ef.}$ is given by Eq. (3), $$Q1_{alpha-ef.} = \alpha \times Q1 \qquad (3)$$

As can be understood from Eqs. (1) and (2), in the drive-timing chart in FIG. 6, the environmental light removal-performance becomes high because the first charge-distributing gate (31a, 31b) for firstly distributing the charges is used dedicatedly for the removal of the unwanted charges ascribable to environmental lights. Thus, the range-measuring device pertaining to the first embodiment is understood to be suitable for use in the environment in which the influence of the environmental lights is great, such as outdoor, bright indoor and the like.

According to the photoelectric-conversion element of TOF architecture, which distributes signals to two directions of right and left, an estimated range L is known to be given by the following Eq. (4). That is, when signal charges transported through a right first transfer electrode and transferred to and accumulated in a right charge-accumulation region are defined as Q1, and signal charges transported through a left second transfer electrode and transferred to and accumulated in a left charge-accumulation region are defined as Q2, the estimated range L of a photoelectric-conversion element of double-direction distributing-scheme is given by Eq. (4).

$$L = (cT_o/2)(Q2/(Q1+Q2)) \qquad (4)$$

Here, c is light velocity, and $T_o$ is an optical projection time (pulse width) of pulsed lights.

On the other hand, an estimated range L by the range-measuring photoelectric-conversion element pertaining to the first embodiment that has the triple-direction distributing structure is understood to be given by the following Eq. (5), by varying Eq. (4) in view of Eqs. (1) and (2).

$$L = (cT_o/2)(Q3_{real(a)}/(Q2_{real(a)} + Q3_{real(a)})) \qquad (5)$$

As illustrated in FIG. 3, a first auxiliary capacitor C1 and a first source-follower amplifying-transistor SF1 (the illustration is omitted) are connected through surface interconnection and others to the first charge-accumulation region 23a. Similarly, a second auxiliary capacitor C2 and a second source-follower amplifying-transistor SF2 (the illustration is omitted) are connected to the second charge-accumulation region 23b, and a third auxiliary capacitor C3 and a third source-follower amplifying-transistor SF3 (the illustration is omitted) are connected to the third charge-accumulation region 23c. A power supply VDD is connected to the charge-exhaust region 23d.

The outline of the operations of the control processor 74 pertaining to the first embodiment illustrated in FIG. 2 can be explained in a procedure of the flow of the flowchart as illustrated in FIG. 5. At Step S101 in FIG. 5, the time-setting logical-circuit 741 in the control processor 74 sets the first charge-accumulation periods $T_{a1}$=the second charge-accumulation periods $T_{a2}$=the third charge-accumulation periods $T_{a3}$. The set-time output-controller 742 delivers the set first charge-accumulation periods $T_{a1}$, second charge-accumulation periods $T_{a2}$ and third charge-accumulation periods $T_{a3}$ as control signals through the interface 76 illustrated in FIG. 1 to the driver 94. On the basis of the control signals supplied through the driver 94 by the set-time output-controller 742 of the control processor 74, pulsed-light emission is performed by the light emitter 91. For the pulsed-light emission, for example, near-infrared laser diode (LD) or near-infrared light emitting diode (LED) is used. The pulsed lights reflected by a target 92 is irradiated through a lens 93, band pass filter (BPF) or the like to the pixel-array area ($X_{11}$ to $X_{1m}$; $X_{21}$ to $X_{2m}$; - - - ; $X_{n1}$ to $X_{nm}$) illustrated in FIG. 1.

Continuously, at Step S102, each pixel $X_{ij}$ in the pixel-array area ($X_{11}$ to $X_{1m}$; $X_{21}$ to $X_{2m}$; - - - ; $X_{n1}$ to $X_{nm}$) operates such that the electrons (photoelectrons) generated by the received-lights behave in each pixel $X_{ij}$ under a drive control with the control signals, which are applied via the driver 94 from the time-setting logical-circuit 741 in the control processor 74. And output signals from the pixel-array area ($X_{11}$ to $X_{1m}$; $X_{21}$ to $X_{2m}$; - - - ; $X_{n1}$ to $X_{nm}$) are transmitted through the output buffers 97 and 98 to the arithmetic logic circuit 71. At Step S102, the arithmetic logic circuit 71 executes a job for calculating a range by using Eq. (5), on the basis of the signals delivered from the respective pixels $X_{ij}$ in the pixel-array area ($X_{11}$ to $X_{1m}$; $X_{21}$ to $X_{2m}$; - - - ; $X_{n1}$ to $X_{nm}$), and executes a range measurement. At Step S102, the arithmetic logic circuit 71 further transmits the range calculated result and collateral calculated result associated with the range calculated result to the time-setting logical-circuit 741 in the control processor 74.

At Step S103 in FIG. 5, the time-setting logical-circuit 741 in the control processor 74 enlarges the third charge-accumulation period $T_{a3}$. The set-time output-controller 742 again delivers the set first charge-accumulation period $T_{a1}$, second charge-accumulation period $T_{a2}$ and third charge-accumulation period $T_{a3}$ as the control signals through the interface 76 illustrated in FIG. 1 to the driver 94. The control signals are transmitted from the set-time output-controller 742 in the control processor 74 to the driver 94, and on the basis of the control signals supplied through the driver 94, the pulsed-light emission is performed by the light emitter 91. And, the pulsed lights reflected by the target 92 are again irradiated through the lens 93, the BPF or the like to the pixel-array area ($X_{11}$ to $X_{1m}$; $X_{21}$ to $X_{2m}$; - - - ; $X_{n1}$ to $X_{nm}$) illustrated in FIG. 1.

And, at Step S104, the operation of each pixel $X_{ij}$ in the pixel-array area ($X_{11}$ to $X_{1m}$; $X_{21}$ to $X_{2m}$; - - - ; $X_{n1}$ to $X_{nm}$) is controlled by the control signals applied via the driver 94 from the time-setting logical-circuit 741 in the control processor 74 so that the electrons generated by the received-lights can move and behave along the predetermined potential profile in each pixel $X_{ij}$, which is provided by the electric fields ascribed by the control signals. And the output signals from the pixel-array area ($X_{11}$ to $X_{1m}$; $X_{21}$ to $X_{2m}$; - - - ; $X_{n1}$ to $X_{nm}$) are transmitted through the output buffers 97 and 98 to the arithmetic logic circuit 71. At Step S104, the arithmetic logic circuit 71 executes the job for calculating the range by using Eq. (5), on the basis of the signals delivered from the respective pixels $X_{ij}$ in the pixel-array area ($X_{11}$ to $X_{1m}$; $X_{21}$ to $X_{2m}$; - - - ; $X_{n1}$ to $X_{nm}$), and executes the jobs for range measurement, and again transmits the range calculated result and the collateral calculated result associated with the range calculated result to the time-setting logical-circuit 741.

At Step S105 in FIG. 5, the set-value judging-circuit 744 judges whether or not an incremental difference between third signal charges Q3 representing dark condition, which are measured and calculated at a immediately preceding timing by the arithmetic logic circuit 71 at Step S104, and third signal charges Q3 representing dark condition which are measured and calculated at a further one cycle preceding timing from Step S104, such as Step S102 and the like, is lower than a threshold, which has been pre-stored in the data memory 72. Or, the set-value judging-circuit 744 judges whether or not an incremental difference between a detected value of a range, which is measured and calculated at the immediately preceding timing by the arithmetic logic circuit 71 at Step S104, and a detected value of a range, which is measured and calculated at the further one cycle preceding timing of the Step S104, such as Step S102 and the like, is lower than a threshold pre-stored in the data memory 72. Here, the term of "representing dark condition" indicates unintentional charges scheduled to be eliminated, for removing the influence of the environmental lights, by carrying out calculations with Eqs. (1) and (2).

At Step S105, if the set-value judging-circuit 744 judges that the incremental difference is not lower than the threshold (answer "Yes"), data is sent to the time-setting logical-circuit 741 in the control processor 74. At Step S106 in FIG. 3, after the time-setting logical-circuit 741 in the control processor 74 enlarges the time intervals of the third charge-accumulation period $T_{a3}$, the time-setting logical-circuit 741 returns to Step S104 and again executes the jobs for range measurement. Hereafter, loop routines that return from Step S104 through Steps S105 and S106 to Step S104 are repeated until the set-value judging-circuit 744 judges that the incremental difference is lower than the threshold (answer "No").

FIG. 6 illustrates the drive-timing chart in which the time intervals of the third charge-accumulation periods $T_{a3}$ are sequentially enlarged step by step in association with the loop routines that return from Step S104 through Steps S105 and S106 to Step S104 in FIG. 5. That is, FIG. 6 illustrates an example of the operations in the control processor 74, in which loop routines are repeated from time of i=0 to 8, in accordance with instructions of the sequence controller 745. When the loop routines are repeated from time of i=0 to 8, the time intervals of the third charge-accumulation periods $T_{a3}$ are sequentially enlarged step by step. And, at time of i=8, the third charge-accumulation period $T_{a3}$ becomes "a G3 output representing the dark condition", at which the incremental difference is lower than the threshold.

Similarly, FIG. 7 also illustrates a manner in which the loop routines, which return from Step S104 through Steps S105 and S106 to Step S104, are repeated in accordance with the instructions of the sequence controller 745, such as at times of i=0 to 11, 12, - - - and the time intervals of the third charge-accumulation periods $T_{a3}$ are sequentially enlarged step by step. Although FIG. 7 is also the timing chart based on the flowchart in FIG. 5, and the third charge-accumulation period $T_{a3}$ corresponds to the third signal charges Q3 representing dark condition, which is lower than the threshold, is supposed to be obtained at time i=8 similarly to FIG. 6, but the range measurements are performed, continuing over time i=8. That is, the number of times for repeating the loop routines, by which the time intervals of the third charge-accumulation periods $T_{a3}$ are sequentially enlarged step by step, is not limited to eight, for checking and evaluating the variation of the third signal charges Q3 representing dark condition, with respect to the variation of the third charge-accumulation periods $T_{a3}$. Then, FIG. 13A illustrates the variation of the third signal charges Q3 representing dark condition, with respect to the variation of the third charge-accumulation periods $T_{a3}$.

Figure 13A:
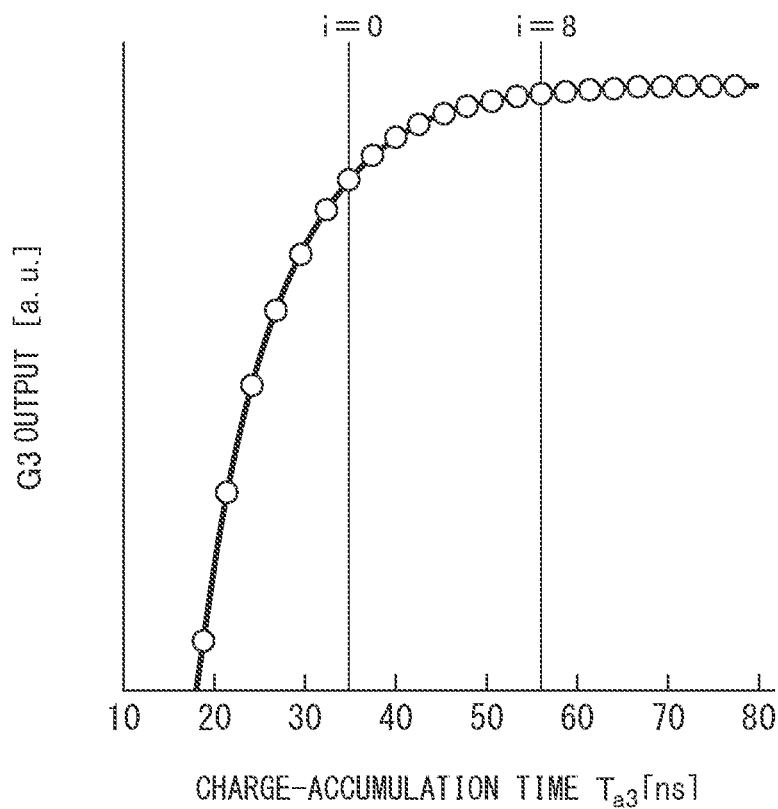
FIG. 13A is a graph illustrating a change in outputs from $G_3$ with respect to the variation of the charge-accumulation periods, in accordance with the range-measuring device pertaining to the first embodiment.

As illustrated in FIG. 13A, as the values of the third charge-accumulation periods $T_{a3}$ become larger, the third signal charges Q3 representing dark condition are increasing to asymptotically approach a certain particular asymptotic value. For example, the value of the third signal charges Q3 at a time of i=8, which is close to an asymptotic value illustrated in FIG. 13A, may be selected as "a threshold". On the other hand, as illustrated in FIG. 13B, the threshold may be determined by plotting a differential value ($=\Delta G_3/\Delta t$) of the third signal charges Q3 representing dark condition with respect to the variation of the third charge-accumulation period $T_{a3}$.

Figure 13B:
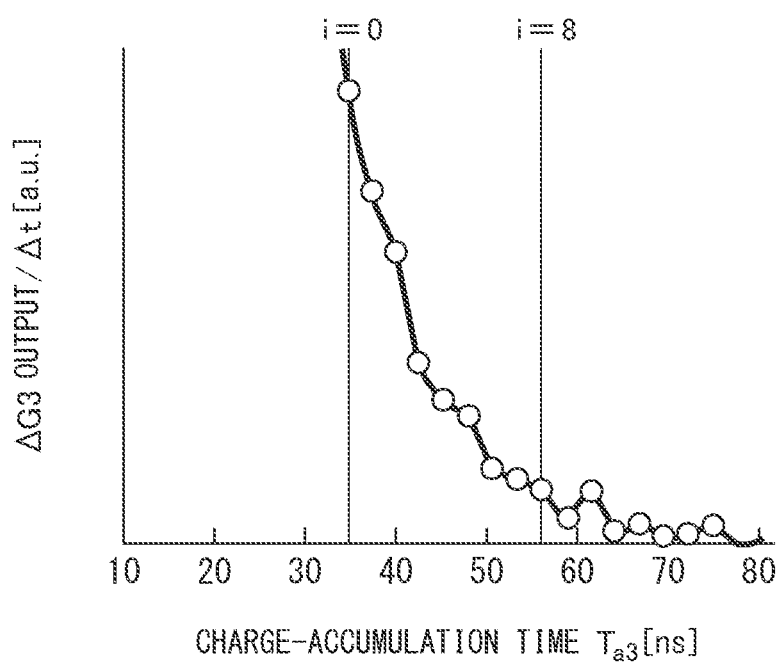
FIG. 13B is a graph illustrating changed amounts (differential values) in the outputs from the $G_3$ with respect to the variation of the charge-accumulation periods, corresponding to FIG. 13A.

The $\Delta t$ defining the differential values $\Delta G_3/\Delta t$, which are represented along ordinate in FIG. 13B, is the increment of time, or the increment of the time intervals of the third charge-accumulation periods $T_{a3}$. That is, in FIG. 13B, a particular value of the differential value of the third signal charges Q3 located between times of i=0 and i=8 can be defined as "the threshold". When the threshold is determined in view of the variation of the differential values illustrated in FIG. 13B, the differential value of the third signal charges Q3 representing dark condition, with respect to the variations of the third charge-accumulation periods $T_{a3}$ at time i=0 is larger than the threshold. When the time i is eight or more, the differential values of the third signal charges Q3 representing dark condition are smaller than the threshold.

And, if the set-value judging-circuit 744 judges that the incremental difference is lower than the threshold (answer "No"), the range-image output-controller 743 in the control processor 74 transmits the data to the output unit 75, and the output signals are delivered by the output unit 75, and the process illustrated in FIG. 5 is ended.

COMPARATIVE EXAMPLE

Figure 8:
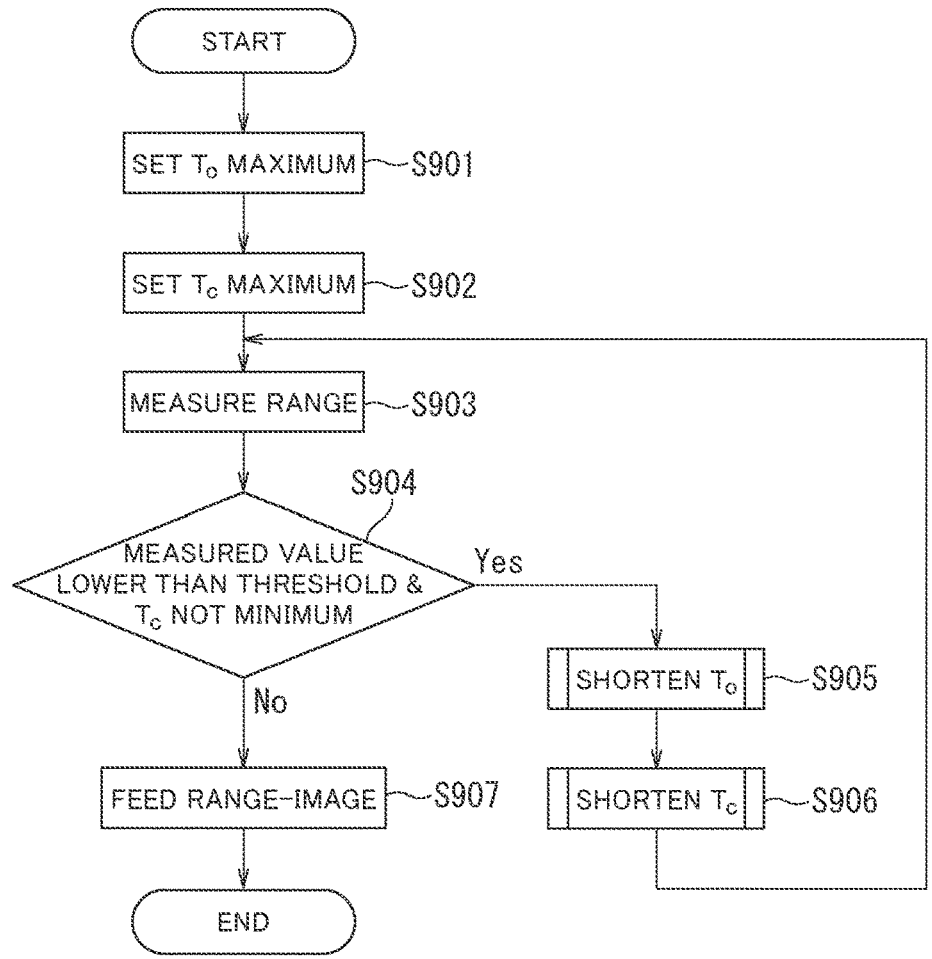
FIG. 8 is a flowchart explaining an outline of an adjusting operation by peripheral circuitry of a range-measuring device pertaining to a comparative example of technology, which has been examined and reviewed prior to the achievement of the present invention.
Figure 9:
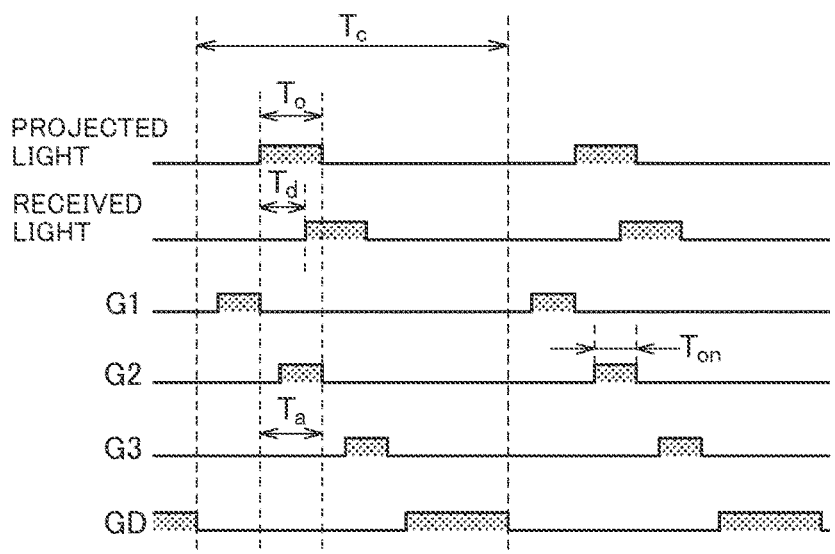
FIG. 9 is a drive-timing chart explaining an operation of the range-measuring device pertaining to the comparative example, when the range-measuring device is adjusted.

FIG. 8 illustrates the flowchart illustrating the outline of the operations of the range-measuring device of the comparative example reviewed at a development stage before the inventor of the present invention has conceived the technical idea of the instant invention. The comparative example illustrated in FIG. 8 is a technology whose purpose is to improve the problems of the earlier triple-branched lock-in pixels, which are disclosed in WO 2007/026779A1 and others. The comparative example is also under controlled by the operations of the control processor 74, which encompasses various logical circuits similar to the hardware resources illustrated in FIG. 2. FIG. 9 illustrates the drive-timing chart corresponding to the flow of the flowchart illustrated in FIG. 8.

At Step S901 in FIG. 8, the time-setting logical-circuit 741 in the control processor 74 sets the light-projection period $T_o$ to a maximum value. Continuously, at Step S902, the time-setting logical-circuit 741 sets the repetitive-cycle period $T_c$ to a maximum value. The set-time output-controller 742 delivers the set light-projection period $T_o$ and repetitive-cycle period $T_c$ as control signals through the interface 76 illustrated in FIG. 1 to the driver 94. On the basis of the control signals supplied through the driver 94 by the set-time output-controller 742 in the control processor 74, the pulsed-light emission is performed by the light emitter 91. The pulsed lights reflected by the target 92 are irradiated through the lens 93, the BPF or the like, to the pixel-array area ($X_{11}$ to $X_{1m}$; $X_{21}$ to $X_{2m}$; - - - ; $X_{n1}$ to $X_{nm}$) illustrated in FIG. 1.

At Step S903 in FIG. 8, the operations of each pixel $X_{ij}$ in the pixel-array area are controlled by the control signals applied via the driver 94 from the time-setting logical-circuit 741 in the control processor 74, so that the electrons, or the photoelectrons generated by the received-lights can move and behave under the drive control with the control signals, and the output signals are transmitted through the output buffers 97 and 98 to the arithmetic logic circuit 71. Then, as illustrated in FIG. 9, the first drive signals $G_1$, the second drive signals $G_2$, the third drive signals $G_3$ and the exhausting drive signals $G_D$ are applied at different timings, respectively, so as to provide offset times in between the first drive signals $G_1$ and the second drive signals $G_2$, in between the second drive signals $G_2$ and the third drive signals $G_3$ and in between the third drive signals $G_3$ and the exhausting drive signals $G_D$. At Step S903, the arithmetic logic circuit 71 executes a job for calculating a range by using Eq. (5), under an assumption of $\alpha$=1 in Eq. (3), using the signals delivered from each of the pixels $X_{ij}$, and executes the jobs for range measurement.

In accordance with of the incremental differences between the signal charges transported through the charge-transfer routes defined at the first charge-distributing gate (31a, 31b), the second charge-distributing gate (32a, 32b), the third charge-distributing gate (33a, 33b) and the charge-exhausting gate (34a, 34b), respectively, the arithmetic logic circuit 71 executes the job for calculating the range by using Eq. (5), under the assumption of $\alpha$=1 in Eq. (3). Here, the first charge-distributing gate (31a, 31b), the second charge-distributing gate (32a, 32b), the third charge-distributing gate (33a, 33b) and the charge-exhausting gate (34a, 34b) implement the EFC electrode pair, respectively. At Step S903, the arithmetic logic circuit 71 further transmits the calculated result of the range calculation to the time-setting logical-circuit 741 in the control processor 74.

At Step S904 in FIG. 8, the set-value judging-circuit 744 in the control processor 74 judges whether or not a drive setting is correct, for the calculated result of the range calculation delivered from the arithmetic logic circuit 71. At Step S904, if the set-value judging-circuit 744 judges the drive setting as "Yes", the data is transmitted to the time-setting logical-circuit 741 in the control processor 74. The time-setting logical-circuit 741 shortens the light-projection period $T_o$, at Step S905 in FIG. 8. Continuously, at Step S906, the time-setting logical-circuit 741 shortens the repetitive-cycle period $T_c$.

The control signals for modifying the drive-condition, such that the light-projection period $T_o$ and the repetitive-cycle period $T_c$ are shortened, are transmitted through the driver 94 illustrated in FIG. 1 to the light emitter 91 and the pixel-array area, and thereafter, the range is measured at Step S903 in FIG. 8. After that, the loop routines that return to Step S903 through Steps S903, S904, S905 and S906 are repeated until the set-value judging-circuit 744 judges the drive setting as "No" at Step S904. And, if the set-value judging-circuit 744 judges the drive-setting as "No", at Step S907, the range-image output-controller 743 in the control processor 74 transmits the data to the output unit 75, and the output signal are delivered from the output unit 75.

Figure 10:
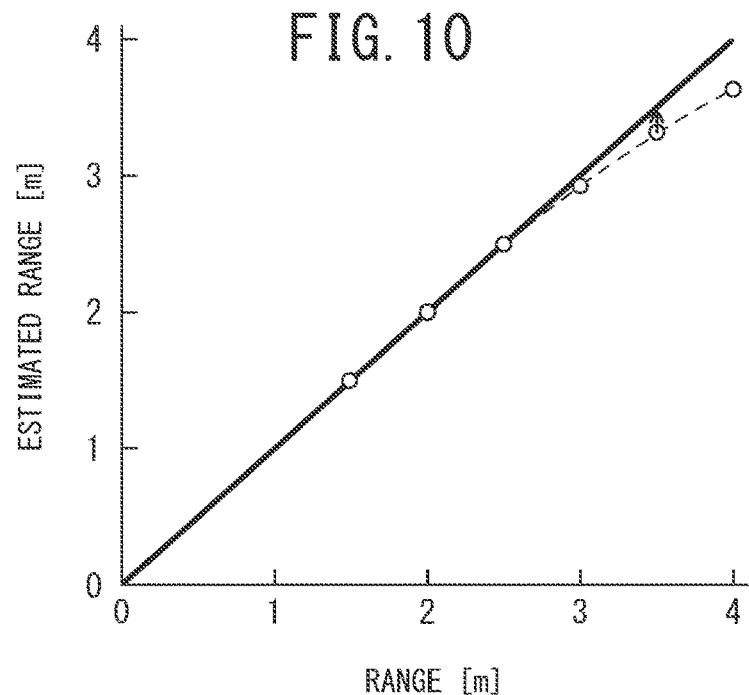
FIG. 10 is a graph illustrating a relation between actual ranges and the estimated vales of ranges, which are measured by the range-measuring device of the comparative example and by the range-measuring device pertaining to the first embodiment.

As illustrated in FIGS. 8 and 9, in the range-measuring device of the comparative example, the range precision can be improved by modifying the time interval of the light-projection period $T_o$ and the repetitive cycle period $T_c$, in accordance with the values of the ranges to be measured. However, in the range-measuring device of the comparative example illustrated in FIGS. 8 and 9, the first charge-accumulation period $T_{a1}$=the second charge-accumulation period $T_{a2}$=the third charge-accumulation period $T_{a3}$=the light-projection period $T_o$=constant. And therefore, there is a problem that the linearity of the estimated range L with respect to the actual range deteriorates as illustrated by a broken line in FIG. 10. FIG. 10 illustrates an actual measured example in a case of set conditions of the light-projection period $T_o$=the first charge-accumulation period $T_{a1}$=the second charge-accumulation period $T_{a2}$=the third charge-accumulation period $T_{a3}$=34 nanoseconds and one-way optical-path length=5.1 meters. Although an ideal condition for achieving the linearity at about five meters is expected, in the actual measured result illustrated in the broken line in FIG. 10, the linearity of the corresponding estimated range L deteriorates from a portion in which the actual range becomes larger than about three meters.

In the driving method of the range-measuring device of the comparative example illustrated in FIGS. 8 and 9, because the value of the third signal charges Q3 representing dark condition defined at time i=0 in FIGS. 6 and 7 is used in the calculation of the range calculation, the linearity in longer-distance image deteriorates as illustrated in the broken line in FIG. 10. However, according to the driving method of the range-measuring device pertaining to the first embodiment, because the value of the third signal charges Q3 representing dark condition defined at time of i=8 is used in the job execution for calculating the range, as illustrated in a thick solid line in FIG. 10, the linearity of the range-measuring data at the range of 3.5 meters is understood to be recovered, as represented by an arrow mark in FIG. 10.

Figure 11:
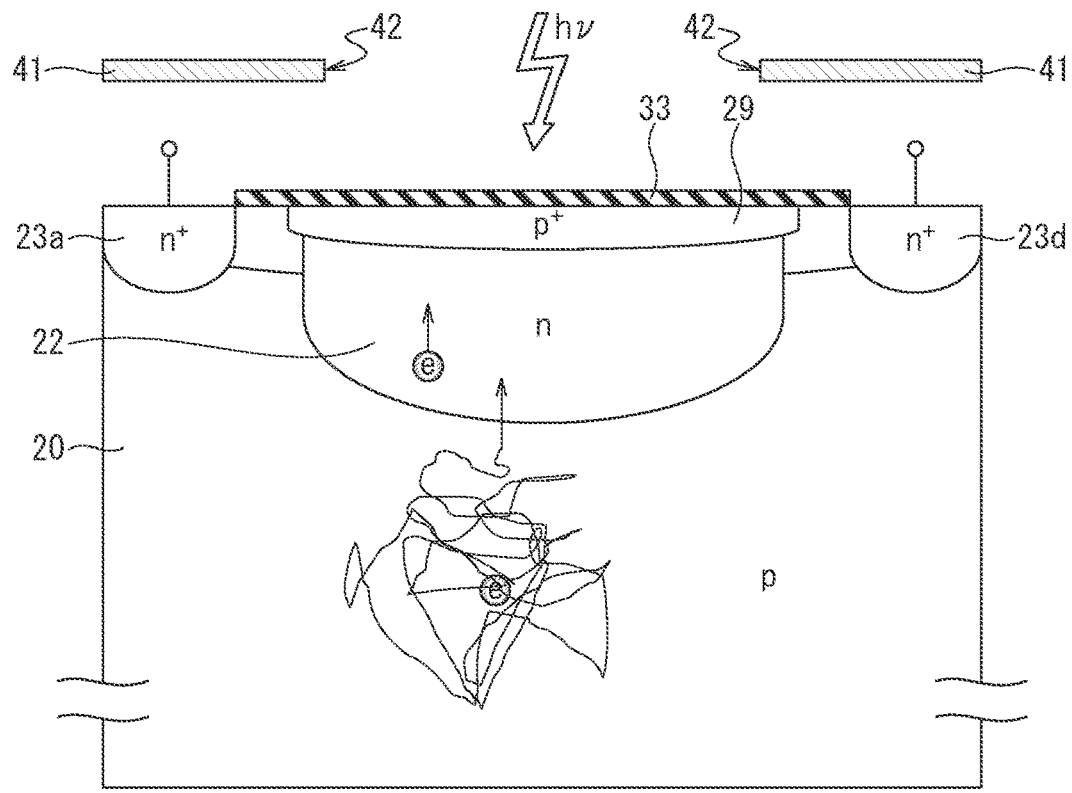
FIG. 11 is a cross-sectional view explaining the behavior of photoelectrons that induces the problems in the range-measuring device of the comparative example.

FIG. 11 is the schematic view explaining the behavior of the photoelectrons, which leads to a reason why the linearity of the estimated range with respect to the actual range deteriorates in the range-measuring device of the comparative example. Lights, or photons passed through the opening 42 of the light shielding film 41 in FIG. 11 are absorbed in the functional-substrate layer 20, and photoelectrons (electrons) are accordingly generated. The lights (photons) are absorbed in the functional-substrate layer 20, such that intensity of the light decays from the surface of the functional-substrate layer 20 with exponential law, and the photoelectrons are generated, as one photoelectron by one photon in the functional-substrate layer 20. However, in order to simplify the explanation, FIG. 11 illustrates two photoelectrons including one shallow photoelectron generated in the surface-buried region 22 close to the surface and one deep photoelectron generated in a relatively deep portion in the functional-substrate layer 20, or a relatively distant portion from the surface of the functional-substrate layer 20, and the behaviors of the two photoelectrons.

The shallow photoelectron generated at a relatively shallow portion in the functional-substrate layer 20 is drift-transported by an electric field applied to the corresponding portion of the functional-substrate layer 20. The shallow photoelectron is instantly transported to the deepest portion with regard to a potential in a depletion layer, which is formed by the p-type functional-substrate layer 20 and the n-type surface-buried region 22, and the shallow photoelectron enter into a standby state in the depletion layer. After that, when the potential of the charge-transfer route defined in the EFC electrode pair, implementing the first charge-distributing gate (31a, 31b) illustrated in FIG. 3, is made lower, the shallow photoelectron is transferred to the first charge-accumulation region 23a, and the shallow photoelectron becomes one of the signals accumulated in the first charge-accumulation region 23a.

Also, the shallow photoelectron generated at the relatively shallow portion in the functional-substrate layer 20 is instantly transported to the deepest potential portion in the depletion layer which is formed by the p-type functional-substrate layer 20 and the n-type surface-buried region 22, and enter the standby state at the deepest potential portion in the depletion layer. When the potential of the charge-transfer route defined in the EFC electrode pair implementing the charge-exhausting gate (34a, 34b) illustrated in FIG. 3 is made lower, the shallow photoelectron is transferred to the charge-exhaust region 23d and exhausted to a power supply (VDD) that is not illustrated.

The deep photoelectron generated in the relatively deep portion in the functional-substrate layer 20 randomly walk for a while, as schematically illustrated in FIG. 11, because the electric field is not applied to the relatively deep portion in the functional-substrate layer 20. After that, when the deep photoelectron arrives at a position inside the functional-substrate layer 20 to which the electric field is applied, due to electric field drift, the deep photoelectron is instantly transported to the deepest potential portion in the depletion layer which is formed by the p-type functional-substrate layer 20 and the n-type surface-buried region 22, and the deep photoelectron enters into the standby state in the deepest potential portion in the depletion layer. After that, when the potential of the charge-transfer route defined in the EFC electrode pair implementing the first charge-distributing gate (31a, 31b) is made lower, the deep photoelectron is transferred to the first charge-accumulation region 23a, and the deep photoelectron becomes one of the signals staying in the first charge-accumulation region 23a.

Or alternatively, after the deep photoelectron generated in the relatively deep portion in the functional-substrate layer 20 randomly walks for a while, and then, the deep photoelectron is supposed to be instantly transported to the deepest potential portion in the depletion layer which is formed by the p-type functional-substrate layer 20 and the n-type surface-buried region 22, and enter the standby state. When the potential of the charge-transfer route defined in the EFC electrode pair implementing the charge-exhausting gate (34a, 34b) is made lower, the deep photoelectron is transferred to the charge-exhaust region 23d and the deep photoelectron is evacuated to the power supply (VDD) that is not illustrated.

FIGS. 12A and 12B are views in which images of a main mechanism, which induces the problem of the range-measuring device of the comparative example, are summarized in corresponding shapes of transient response waveforms. FIG. 12A illustrates the ideal state. In FIG. 12A, $T_o$ indicates a light projection period, $T_d$ indicates a delay time of received light, and $T_{aeff}$ indicates a time interval necessary for charge accumulation. If the ideal rectangular projected pulsed light is emitted, the received light having the same shape as the projected pulsed light is returned at a delay of the delay time $T_d$, in accordance with the values of the ranges. And, if the returned received light is irradiated through the opening 42 of the light shielding film 41 to the light-receiving portion of the range-measuring device of the comparative example, a rectangular profile of photoelectron distribution shall also be obtained, the rectangular profile has the same shape as the waveform of the projected pulsed light.

FIG. 12B illustrates a situation in which the behaviors of the photoelectrons in the functional-substrate layer 20 illustrated in FIG. 11 are considered. Even in FIG. 12B, $T_o$ indicates a light projection period, $T_d$ indicates a delay time of received light, $T_{aeff}$ indicates a time interval necessary for charge accumulation, and $T_{oeff}$ indicates an effective light projection period. FIG. 12B illustrates that, even if the ideal rectangular projected pulsed light is emitted and the received light having the same shape as the projected pulsed light is returned at the delay of the delay time $T_d$ in accordance with the values of ranges, in a case that the returned received light are irradiated to the light-receiving portion of the range-measuring device of the comparative example and photo-electrically converted, the broadening and spread of the photo-electrically converted positions causes the broadening of the times for collecting photoelectrons in the first charge-accumulation region 23a, the second charge-accumulation region 23b, the third charge-accumulation region 23c and others. And, therefore the waveform is deformed by the scattering and delay of the times for collecting photoelectrons.

Variation of First Embodiment

In the range-measuring device pertaining to the first embodiment, the time interval of the third charge-accumulation periods $T_{a3}$ have been enlarged for executing the linear compensation of environmental lights in time domain. Ascribable to the environmental lights, the sum of the charge-accumulation amounts in the third charge-accumulation region 23c and the third auxiliary capacitor C3 becomes larger and larger in proportion to the enlargement of the accumulation period. Consequently, occurrences of the situations in which the pixels are saturated are increased due to the increased amount of the sum of the charge-accumulation amounts in the third charge-accumulation region 23c and the third auxiliary capacitor C3. In order to improve the above problem of the increased situations with the saturated pixels, it is enough that the sum of the charge-accumulation amounts in the third charge-accumulation region 23c and the third auxiliary capacitor C3 is designed to be larger than each of the sum of the charge-accumulation amounts in the first charge-accumulation region 23a and the first auxiliary capacitor C1 and the sum of the charge-accumulation amounts in the second charge-accumulation region 23b and the second auxiliary capacitor C2.

Second Embodiment

Figure 14:
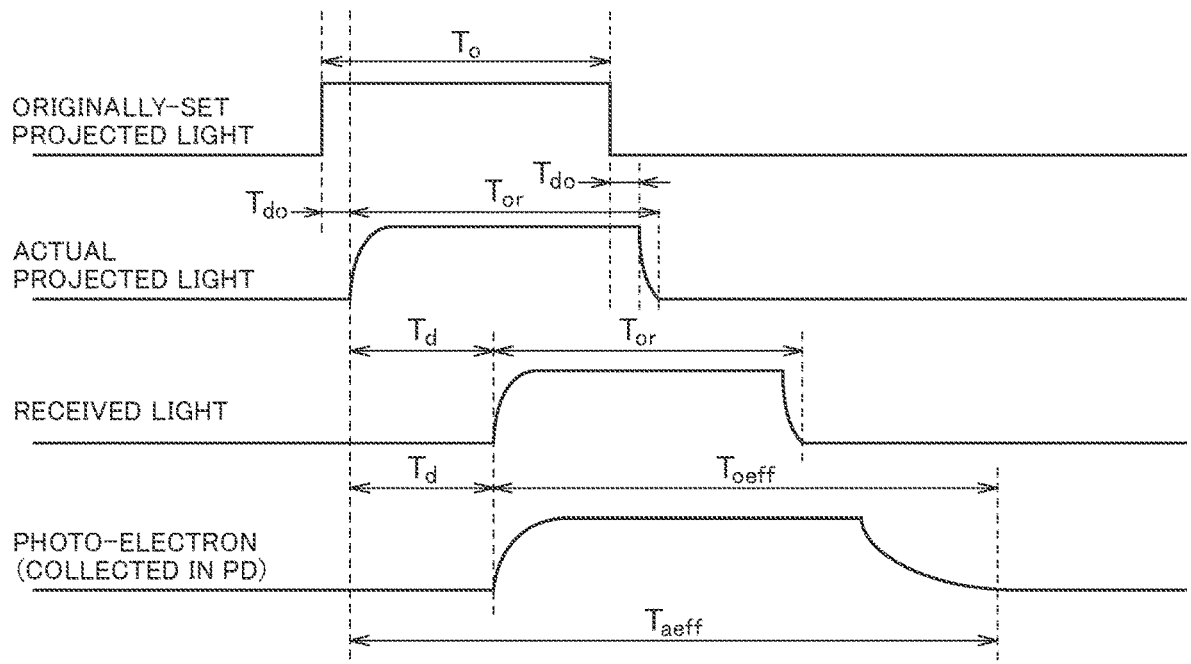
FIG. 14 is a waveform explaining an operation of a range-measuring device pertaining to a second embodiment.

An example of the configuration as to a range-measuring device pertaining to a second embodiment can be illustrated in FIGS. 1 to 4, similarly to the range-measuring devices pertaining to the first embodiment and the variation of the first embodiment. FIG. 14 is the view schematically illustrating waveforms of transient responses according to the range-measuring device pertaining to the second embodiment. Reversely, as to the range-measuring devices pertaining to the first embodiment and the variation of the first embodiment, the waveforms illustrated in FIG. 14 shall correspond to the view illustrated in FIG. 12B. In the first embodiment and the variation of the first embodiment, the distortions in the waveforms of the projected lights are not considered. However, actually, as illustrated in FIG. 14, the delay is generated in the projected light itself, and its waveform is distorted. The received lights are incident at a delay corresponding to values of ranges to a subject. With the same reasons described in the first embodiment and the variation of the first embodiment, the photoelectrons are further delayed from the projected light waveform, and the waveforms are accordingly distorted.

Figure 15:
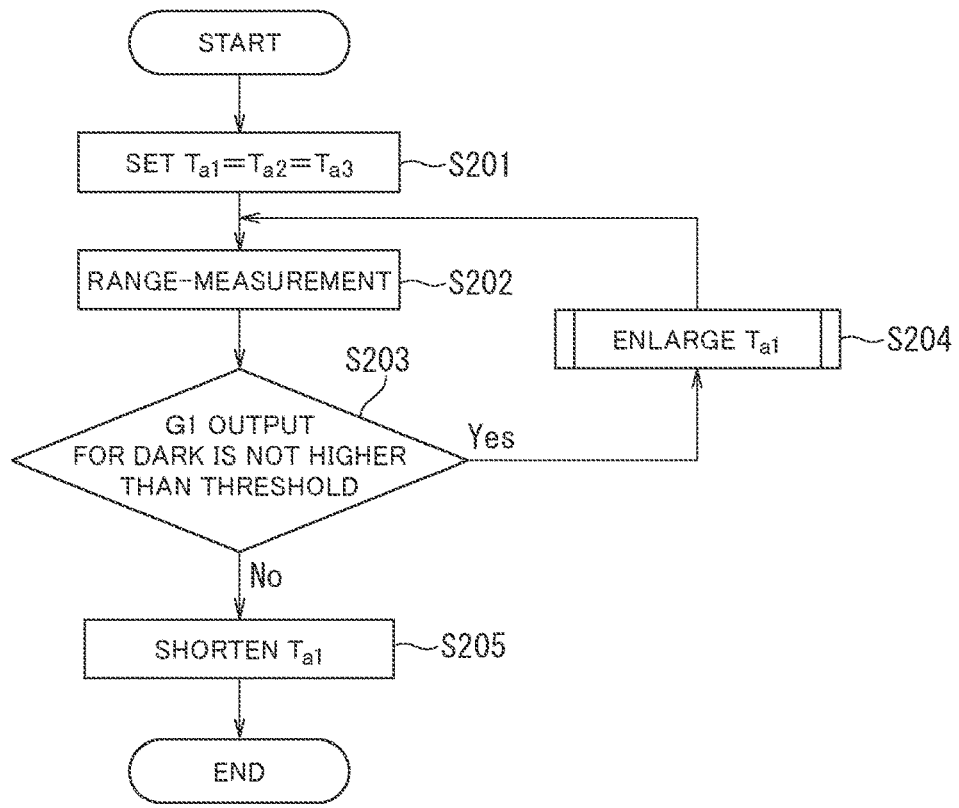
FIG. 15 is a flowchart explaining an outline of a flow of an adjusting operation by peripheral circuitry in the range-measuring device pertaining to the second embodiment, focusing to the control processor illustrated in FIG. 1.

FIG. 15 illustrates an outline of operations of a control processor 74 in the range-measuring device pertaining to the second embodiment, in a flowchart. Through the procedures in the flowchart, the influence of environmental lights can be removed from the range-measured values, by performing the compensation process with Eqs. (6) to (9), which will be described later. However, it is desirable to perform the range measurement under an actual dark environment, in which the influence of the environmental lights is actually avoided, because it becomes simple to remove the influence of environmental lights, in conducting the procedures prescribed by the flowchart. Furthermore, operations under the under actual dark environment is preferable, because the precision of the measured ranges can be made higher.

At Step S201 in FIG. 15, the time-setting logical-circuit 741 in the control processor 74 determines the first charge-accumulation period $T_{a1}$=the second charge-accumulation period $T_{a2}$=the third charge-accumulation period $T_{a3}$. The set-time output-controller 742 delivers the determined first charge-accumulation period $T_{a1}$, second charge-accumulation period $T_{a2}$ and third charge-accumulation period $T_{a3}$ as the control signals through the interface 76 illustrated in FIG. 1 to the driver 94. On the basis of the control signals supplied through the driver 94 by the set-time output-controller 742 in the control processor 74, the pulsed-light emission is performed by the light emitter 91.

Continuously, at Step S202, in each pixel $X_{ij}$ in the pixel-array area ($X_{11}$ to $X_{1m}$; $X_{21}$ to $X_{2m}$; - - - ; $X_{n1}$ to $X_{nm}$), the electrons, or the photoelectrons generated by the received-lights move and behave under the drive control with the control signals applied via the driver 94 from the time-setting logical-circuit 741 in the control processor 74, and the output signals are transmitted through the output buffers 97 and 98 to the arithmetic logic circuit 71. At Step S102, the arithmetic logic circuit 71 executes a job for calculating a range by using Eqs. (6) to (9) which will be described later, on the basis of the signals sent from the respective pixels $X_{ij}$ in the pixel-array area ($X_{11}$ to $X_{1m}$; $X_{21}$ to $X_{2m}$; - - - ; $X_{n1}$ to $X_{nm}$), and executes the jobs for range measurement. At Step S202, the arithmetic logic circuit 71 further transmits the calculated result of the range calculation to the time-setting logical-circuit 741 in the control processor 74.

Figure 16:
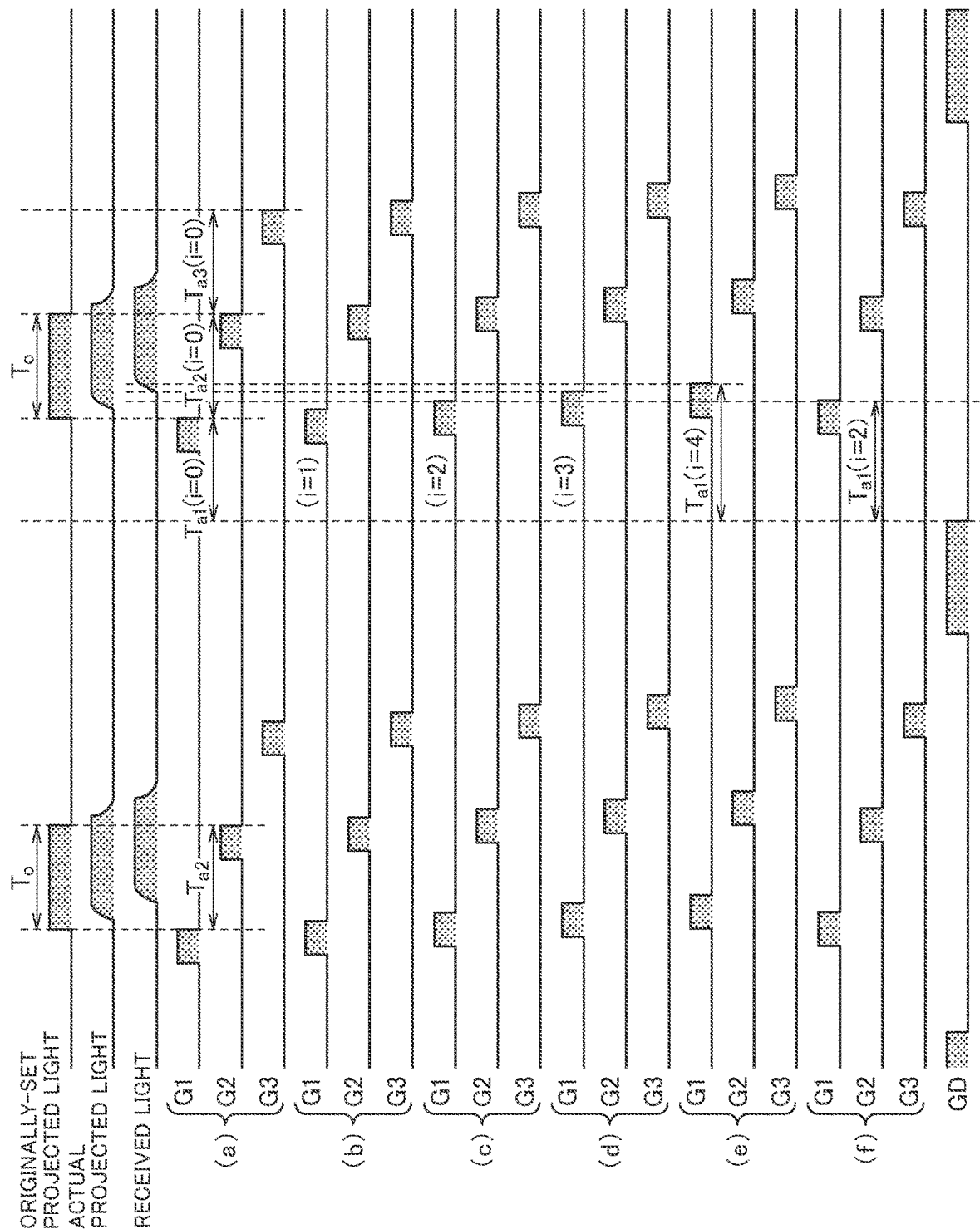
FIG. 16 is a drive-timing chart explaining an operation of the range-measuring device pertaining to the second embodiment, when the range-measuring device is adjusted.

At Step S202 in FIG. 15, the set-value judging-circuit 744 judges whether or not the first signal charges Q1 corresponding to dark condition is higher than a threshold pre-stored in the data memory 72. However, the above first signal charges Q1 is never judged as "No" at a first measurement. As illustrated in FIG. 16, light emissions are performed synchronously with timings at which the charges are accumulated in the second charge-accumulation region 23b. Times when light emissions are performed are always delayed from timings at which the charges are accumulated in the second charge-accumulation region 23b, and the times when the lights are received are further delayed from the times when the light emissions are performed. Thus, at the initial setting, the first signal charges Q1 corresponding to dark condition never exceeds the threshold.

At Step S203, if the set-value judging-circuit 744 judges the above first signal charges Q1 as "Yes", data is transmitted to the time-setting logical-circuit 741 in the control processor 74. After the time-setting logical-circuit 741 in the control processor 74 enlarges the time intervals of the first charge-accumulation period $T_{a1}$ at Step S204 in FIG. 15, the time-setting logical-circuit 741 executes the jobs for range measurement at Step S202. Hereafter, loop routines which return through Steps S202, S203 and S204 to Step S202 are repeated until the set-value judging-circuit 744 judges the above first signal charges Q1 as "No" at Step S203. And, if the set-value judging-circuit 744 judges the above first signal charges Q1 as "No", at Step S205, the time-setting logical-circuit 741 in the control processor 74 shortens the time interval of the first charge-accumulation period $T_{a1}$ to a value at a time when one cycle or more ago, namely the time when the first signal charges Q1 corresponding to dark condition does not exceed the threshold, and the process is ended.

The estimated range L, which is estimated by the range-measuring device pertaining to the second embodiment is represented by the following Eqs. (6) to (9).

$$Q2_{real(b)} = Q2 - Q1_{beta\text{-}ef.} \qquad (6)$$

$$Q3_{real(b)} = Q3 - Q1_{beta\text{-}ef.} \qquad (7)$$

$$Q1_{beta\text{-}ef.} = \beta \times Q1 \qquad (8)$$

$$L = (cT_o/2)(Q3_{real(b)}/(Q2_{real(b)} + Q3_{real(b)})) \qquad (9)$$

Here, β indicates the enlargement rate of the time interval of the first charge-accumulation period $T_{a1}$. The range-measuring device pertaining to the second embodiment can enlarge the time interval of the first charge-accumulation period $T_{a1}$ by using the time-setting logical-circuit 741 in the control processor 74 illustrated in FIG. 2. Thus, as indicated in Eqs. (6) to (9), the linear compensation of the environmental lights in time domain may be performed on the basis of the enlargement rate β of the time interval of the first charge-accumulation period $T_{a1}$.

FIG. 16 is the timing chart based on the flowchart in FIG. 15. FIG. 16 illustrates an example in which the time intervals of the first charge-accumulation period $T_{a1}$ are enlarged at times from i=0 to i=4 sequentially step by step, and at a time i=4, the first signal charges Q1 corresponding to dark condition exceeds the threshold. In the example illustrated in FIG. 16, at a time of Step S205 in the flowchart illustrated in FIG. 15, the time interval of the first charge-accumulation period $T_{a1}$ is shortened to a value at a time of i=2. The reason why the time interval of the first charge-accumulation period $T_{a1}$ is shortened to the value at time of i=2 is such that in light of various dispersions or miscellaneous variability, a margin is prepared for a safer situation.

What are important in the sequence in the flow chart lie in the technical subject matter that the received light becoming a range information signal is not received in the first charge-accumulation period $T_{a1}$ used to compensate the environmental lights, and the technical subject matter that a time when the first charge-accumulation period $T_{a1}$ is ended shall be as short to an instant at the leading edge of the received light as possible. Accordingly, the extent of measurable range can be enlarged without providing any change of "the shortest measurable range", which is defined at the shorter-range side in the measurement, because the durations in the second charge-accumulation period $T_{a2}$ and the third charge-accumulation period $T_{a3}$ can be fully used.

Variation of Second Embodiment

In the range-measuring device pertaining to the second embodiment, as the time intervals of the first charge-accumulation periods $T_{a1}$ are enlarged so as to execute the linear compensation of environmental lights in time domain, the sum of the charge-accumulation amounts in the first charge-accumulation region 23a and the first auxiliary capacitor C1 becomes larger, proportionally to accumulation periods owing to the unwanted charges ascribable to environmental lights. Consequently, occurrences of the situations in which the pixels are saturated are increased, due to the increase amount of the sum of the charge-accumulation amounts in the first charge-accumulation region 23a and the first auxiliary capacitor C1. In order to improve the above increase of the situations as to the saturated pixels, it is enough to design such that the sum of the charge-accumulation amounts in the first charge-accumulation region 23a and the first auxiliary capacitor C1 is larger than the sum of the charge-accumulation amounts in the second charge-accumulation region 23b and the second auxiliary capacitor C2, or is larger than the sum of the charge-accumulation amounts in the third charge-accumulation region 23c and the third auxiliary capacitor C3.

Third Embodiment

Figure 17:
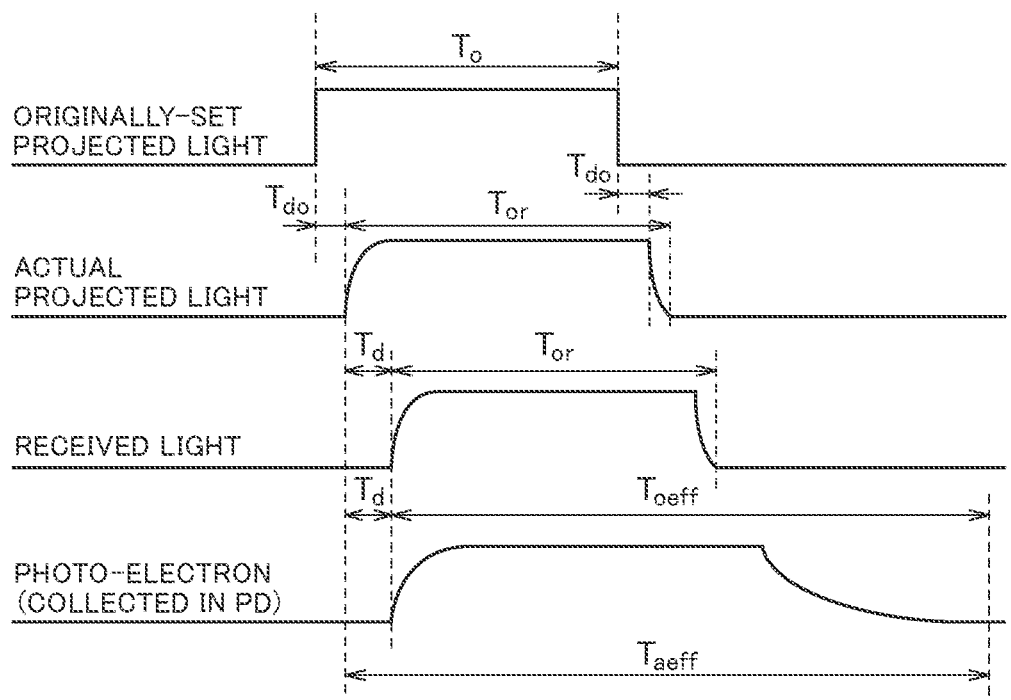
FIG. 17 is a waveform explaining an operation of a range-measuring device pertaining to a third embodiment.
Figure 18:
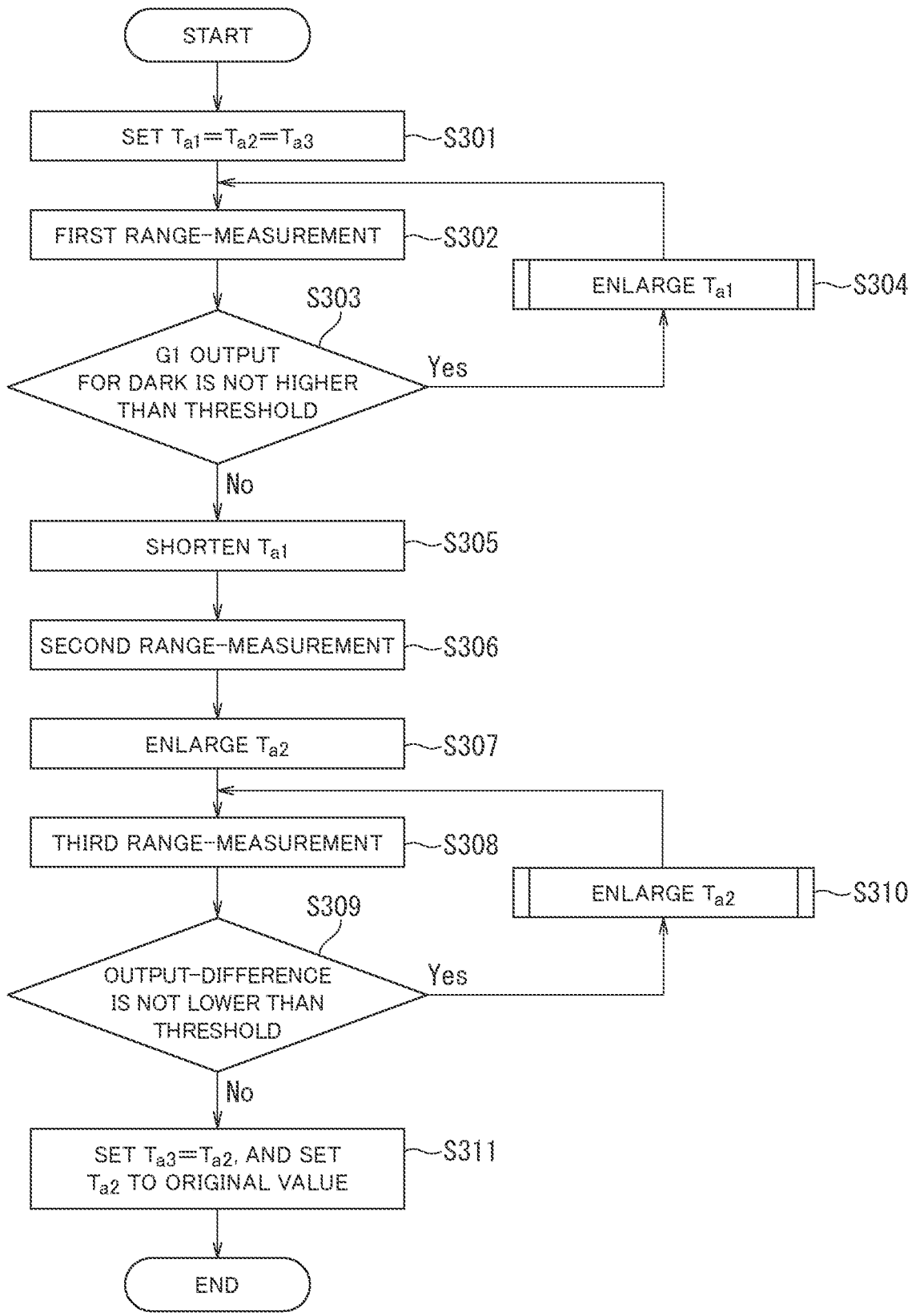
FIG. 18 is a flowchart explaining an outline of a flow of an adjusting operation by peripheral circuitry in the range-measuring device pertaining to the third embodiment.
Figure 19:
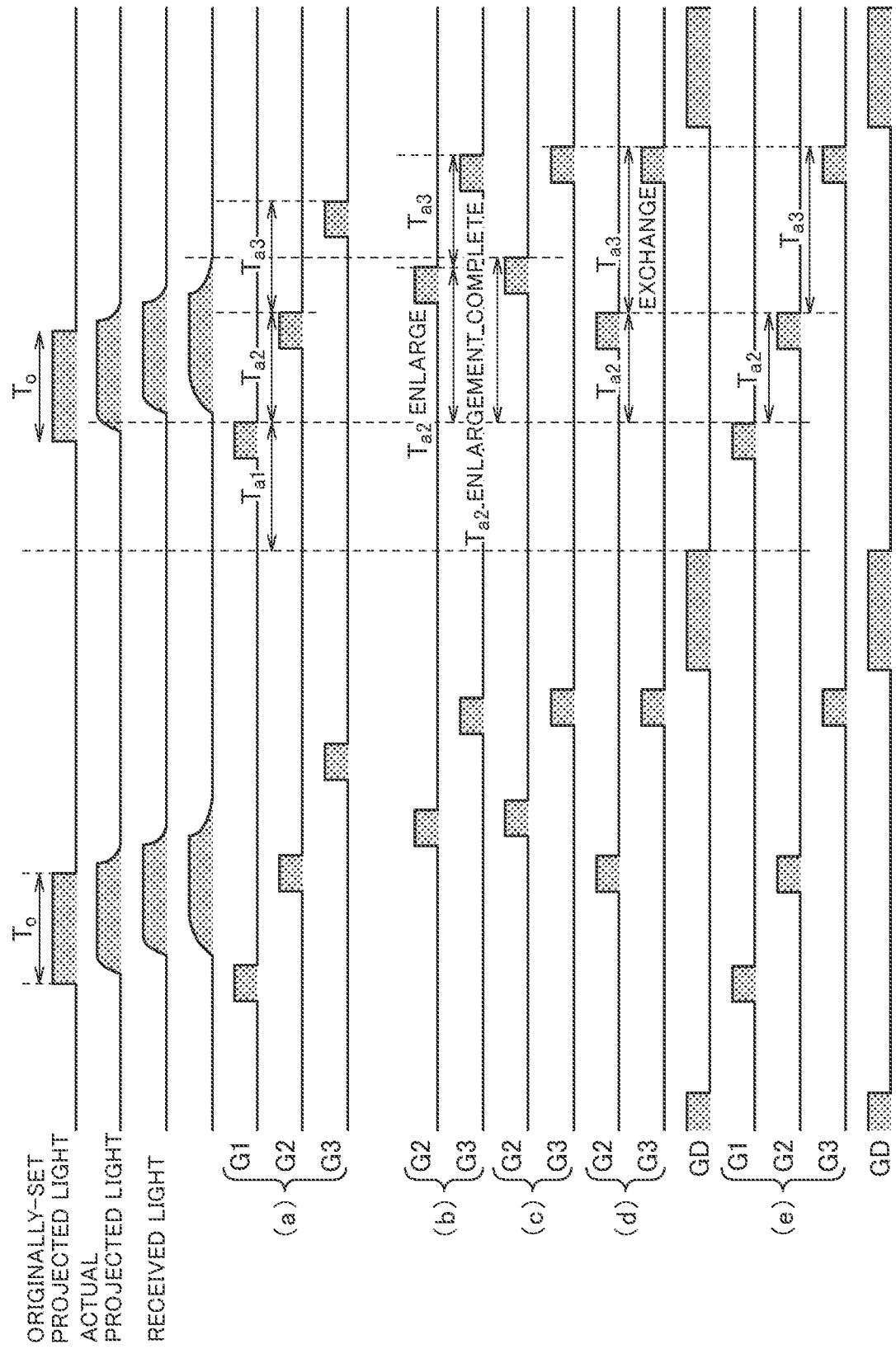
FIG. 19 is a drive-timing chart explaining the operation of the range-measuring device pertaining to the third embodiment, when the range-measuring device is adjusted.

An example of the configuration as to a range-measuring device pertaining to a third embodiment can be illustrated in FIGS. 1 to 4, similarly to the range-measuring devices pertaining to the first and second embodiments. FIG. 17 is the view schematically illustrating waveforms of transient responses according to the range-measuring device pertaining to the third embodiment. FIG. 18 is a flowchart illustrating an outline of an operation of a control processor 74 in the range-measuring device pertaining to the third embodiment. FIG. 19 is the timing chart based on the flowchart in FIG. 18. The waveforms illustrated in FIG. 17 illustrates a situation in which a target to be measured is located at "the shortest measurable range". In the flowchart in FIG. 18, a process flow in which the time intervals of the second charge-accumulation periods $T_{a2}$ are enlarged is added to the flowchart in FIG. 15. The added process flow in which the time intervals of the second charge-accumulation periods $T_{a2}$ are enlarged is substantially similar to the flow in which the time intervals of the third charge-accumulation periods $T_{a3}$ of the range-measuring device pertaining to the first embodiment are enlarged. That is, the third embodiment is equivalent to the combination of the first embodiment and the second embodiment. Thus, it is possible to achieve the improvements of the linearity of the long-distance image and the expansion of the range-measurable span, at the same time.

From a range-measured value at a time of execution of the flowchart in FIG. 18, the influence of the environmental lights can be removed by performing compensation processes based on the following Eqs. (10) to (14). However, it is desirable to perform the range measurement according to the process flow of the flowchart illustrated in FIG. 18, under an actual dark environment, in which the influence of the environmental lights is actually avoided, because it becomes simple to remove the influence of environmental lights. Furthermore, operations under the under actual dark environment is preferable, because the precision of the measured ranges can be made higher. The estimated range L, which is estimated by the range-measuring device pertaining to the third embodiment is represented by the following Eqs. (10) to (14).

$$Q2_{real(c)} = Q2 - Q1_{beta\text{-}ef.} \quad (10)$$

$$Q3_{real(c)} = Q3 - Q1_{gamma\text{-}ef.} \quad (11)$$

$$Q1_{beta\text{-}ef.} = \beta \times Q1 \quad (12)$$

$$Q1_{gamma\text{-}ef.} = \gamma \times Q1 \quad (13)$$

$$L = (cT_o/2)(Q3_{real(c)}/(Q2_{real(c)} + Q3_{real(c)})) \quad (14)$$

Here, β indicates the enlargement rate of the time interval of the first charge-accumulation period $T_{a1}$, and γ indicates the enlargement rate of the time interval of the third charge-accumulation period $T_{a3}$. The range-measuring device pertaining to the third embodiment can enlarge the time intervals of the first charge-accumulation period $T_{a1}$ and the third charge-accumulation period $T_{a3}$ by using the time-setting logical-circuit 741 in the control processor 74 illustrated in FIG. 2. Thus, as indicated in Eqs. (10) to (14), the linear compensation of the environmental lights in time domain may be performed on the basis of the enlargement rate β of the time interval of the first charge-accumulation period $T_{a1}$ and the enlargement rate γ of the time interval of the third charge-accumulation period $T_{a3}$.

In earlier technology, all of the respective charge-accumulation periods were set to the same time length. On the contrary, in the third embodiment, the respective charge-accumulation periods can be set to the values differing from each other. Thus, with regard to the amendment of the range-measuring calculation equations, the linear compensation shall be performed only on each of the charge-accumulation periods in the range-measuring calculation equations. That is, in driving image sensor pixels in the third embodiment of the present invention, because all of the respective charge-accumulation periods are not always required to be set to the same value, each of the time intervals of the charge-accumulation period may be modified so as to have an optimal value, in response to situations.

Variation of Third Embodiment

In the third embodiment, since the time intervals of the first charge-accumulation period $T_{a1}$ and the third charge-accumulation period $T_{a3}$ are enlarged so as to execute the linear compensation for the environmental lights in time domain, the sum of the charge-accumulation amounts in the first charge-accumulation region 23a and the first auxiliary capacitor C1 and the sum of the charge-accumulation amounts in the third charge-accumulation region 23c and the third auxiliary capacitor C3 become larger, respectively, proportional to an increase of the accumulation periods owing to the unwanted charges ascribable to environmental lights. Consequently, occurrences of the situations in which the pixels are saturated are increased due to the increased amount of the sum of the charge-accumulation amounts in the first charge-accumulation region 23a and the first auxiliary capacitor C1 and the sum of the charge-accumulation amounts in the third charge-accumulation region 23c and the third auxiliary capacitor C3. In order to improve the situations with the saturated pixels, it is enough that the sum of the charge-accumulation amounts in the first charge-accumulation region 23a and the first auxiliary capacitor C1 and the sum of the charge-accumulation amounts in the third charge-accumulation region 23c and the third auxiliary capacitor C3 shall be designed to be larger than the sum of the charge-accumulation amounts in the second charge-accumulation region 23b and the second auxiliary capacitor C2, respectively.

Fourth Embodiment

Figure 21:
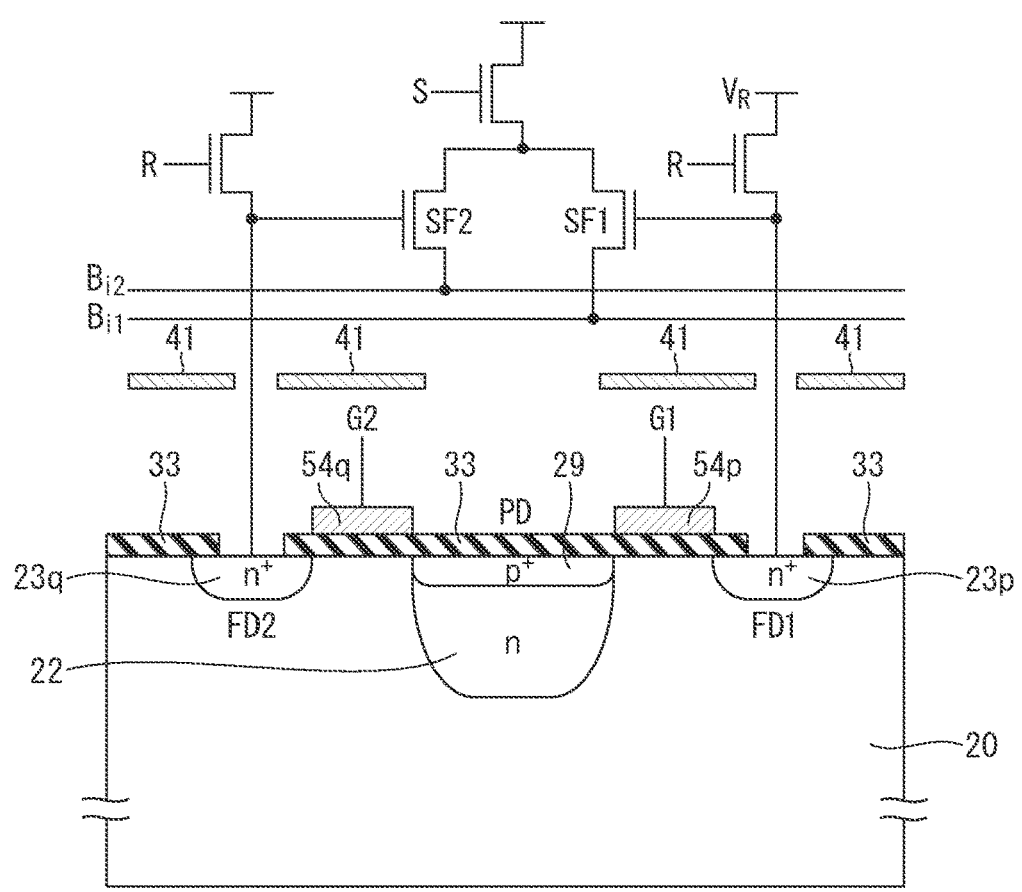
FIG. 21 is a cross-sectional view illustrating a structure, focusing to a photoelectric-conversion transfer-unit of a pixel in the range-measuring device pertaining to the fourth embodiment.

FIG. 21 illustrates a cross-sectional view of a main portion of a pixel in a range-measuring device pertaining to a fourth embodiment. The main portion of the pixel includes a functional-substrate layer 20 made of a p-type semiconductor layer, an n-type surface-buried region 22 buried in a part of an upper portion of the functional-substrate layer 20, a photoelectric-conversion region (29, 22) including a $p^+$ type pinning layer 29, which is arranged in contact with a surface of the surface-buried region 22, and a gate insulating-film 33 laminated on the photoelectric-conversion region (29, 22). And, the central portion of the photoelectric-conversion region (29, 22) is defined as a light-receiving region. A first charge-accumulation region 23p of $n^+$ type and a second charge-accumulation region 23q of $n^+$ type are buried in a part of the upper portion of the functional-substrate layer 20, separately from each other. The first charge-accumulation region 23p and the second charge-accumulation region 23q are arranged at two positions symmetric with respect to the center of the photoelectric-conversion region (29, 22) so as to surround the photoelectric-conversion region (29, 22). And, each of the first charge-accumulation region 23p and the second charge-accumulation region 23q has higher impurity concentration than the functional-substrate layer 20. The first charge-accumulation region 23p is assigned as a first floating drain region FD1, and the second charge-accumulation region 23q is assigned as a second floating drain region FD2.

To a region where light is shielded, except an opening, by a light shielding film 41, a first charge-distributing gate 54p ($G_1$) and a second charge-distributing gate 54q ($G_2$) are connected. The first charge-distributing gate 54p ($G_1$) and the second charge-distributing gate 54q ($G_2$) serve as two charge-distributing gates, implementing mechanisms of insulated-gate transistor structures with the gate insulating-film 33. The first charge-accumulation region 23p and the second charge-accumulation region 23q are connected, respectively, as drain regions of the insulated-gate transistors implementing the charge-distributing gates. Although illustration is omitted, a first auxiliary capacitor C1 and a second auxiliary capacitor C2, and source-follower amplifying-transistors SF1 and SF2 are connected through surface interconnections and others to the first charge-accumulation region 23p and the second charge-accumulation region 23q, respectively.

Photoelectrons collected in the light-receiving region of the photoelectric-conversion region (29, 22) are transported to a floating drain region connected to a specific transfer-gate electrode side, whose channel (charge-transfer route) is in conductive-state. The charge-transfer route becomes conductive-state when one of the channels, or one of the charge-transfer routes among the first charge-distributing gate 54p and the second charge-distributing gate 54q is turned on. If the pulsed lights are supposed to be emitted from the substantially same position as the imaging element illustrated in FIG. 21, the reflected lights from the target 92 (please refer FIG. 1) will be received by the imaging element. The received lights are incident on the imaging element retarded by a delay time $T_d$ from times when projected lights are emitted, in accordance with the values of the ranges between the target 92 and the imaging element. When an optical projection time $T_o$ of the projected lights are made synchronous with on/off operations of voltage pulses applied to the first charge-distributing gate 54p and the second charge-distributing gate 54q, which are assigned to the first charge-accumulation region 23p, and in response to pulses applied to the first charge-distributing gate 54p or the second charge-accumulation region 23q, respectively, signal charges are accumulated in the first charge-accumulation region 23p or the second charge-accumulation region 23q. And, because a difference is generated between the accumulated charge amounts in the first charge-accumulation region 23p and the second charge-accumulation region 23q, corresponding to the operations of the respective transfer-gate electrodes, on the basis of the delay time Ta of the received light, namely, the range between the range-measuring device and the target 92, it is possible to estimate ranges to the target 92.

However, actually, other delays are generated in each of the received lights incident on the light-receiving region of the photoelectric-conversion region (29, 22), in addition to the delay times Ta of the received lights generated in accordance with the values of ranges between the range-measuring device and the target 92. Photons of the received lights are absorbed in the functional-substrate layer 20, such that intensity of the light decays from the surface of the photoelectric-conversion region (29, 22) with exponential law, and the photoelectrons are generated at each of the sites in the photoelectric-conversion region (29, 22), as one photoelectron by one photon. Thus, various time differences are generated in time domain for each of the photoelectrons generated in various portions, which may be relatively close to the surface, and the each of the photoelectrons arrive at the charge-accumulation regions from and through the light-receiving region of the photoelectric-conversion region (29, 22) and through the corresponding gates. That is, due to the scattering and dispersion of the various photo-electrically converted positions, broadening is generated in the collection times, in which the photoelectrons are collected in the photoelectric-conversion region (29, 22). And therefore, the broadening in the collection times of the photoelectrons, which arrive individually at different times to the charge-accumulation regions through the corresponding gates, generate the additional delays other than the delay times $T_d$ determined by the ranges between the range-measuring device and the target 92.

Figure 20A:
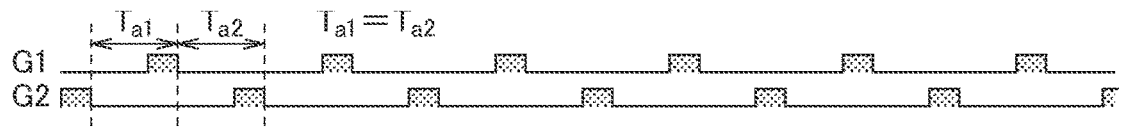
FIG. 20A is a drive-timing chart explaining an operation of a range-measuring device pertaining to the comparative example of technology, when the range-measuring device is adjusted.
Figure 20B:
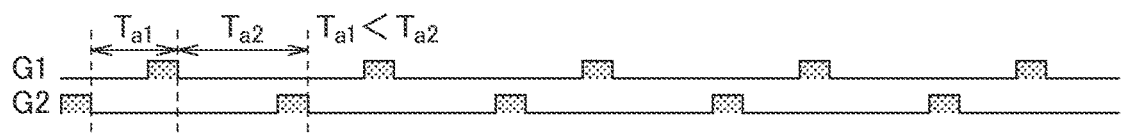
FIG. 20B is a drive-timing chart explaining an operation of a range-measuring device pertaining to a fourth embodiment, when the range-measuring device is adjusted.

In earlier art, the time intervals of the charge-accumulation periods were set to be the same. In the range-measuring device pertaining to the fourth embodiment, for minimizing the deterioration of the range precision caused by the delayed arrivals of the photoelectrons, the charge-accumulation periods are set to lengths differing from each other, by using the time-setting logical-circuit 741 in the control processor 74 illustrated in FIG. 2. Concretely, such as the driving pulses in the first embodiment, the time-setting logical-circuit 741 makes the time intervals of the second charge-accumulation periods $T_{a2}$ in which charges are accumulated in the second charge-accumulation region 23q longer than the time interval of the first charge-accumulation period $T_{a1}$ in which charges are accumulated in the first charge-accumulation region 23p. FIG. 20B is the timing chart illustrating the driving pulses of the range-measuring device pertaining to the fourth embodiment, and FIG. 20A is the timing chart illustrating the driving pulses of the range-measuring device of the comparative example.

In the range-measuring device pertaining to the fourth embodiment, each of the charges arriving at the light-receiving region of the photoelectric-conversion region (29, 22) is transferred to and accumulated in one of the first charge-accumulation region 23p and the second charge-accumulation region 23q. With regard to the driving pulses in the range-measuring device of the comparative example that is described in FIG. 20A, in a case of the distant target 92, because the electrons scheduled to enter the second charge-accumulation region 23q will enter the first charge-accumulation region 23p scheduled in a next cycle, the range precision becomes lower. That is, the electrons scheduled to enter into the second charge-accumulation region 23q have unintentionally entered in the first charge-accumulation region 23p designed at the next cycle, in the case of the driving pulses in the range-measuring device of the comparative example, which is described in FIG. 20A. On the contrary, the scheduled electrons shall absolutely enter into the second charge-accumulation region 23q, without entering into the first charge-accumulation region 23p scheduled at the next cycle, by the driving pulses according to the range-measuring device pertaining to the fourth embodiment, which is described in FIG. 20B.

Figure 23:
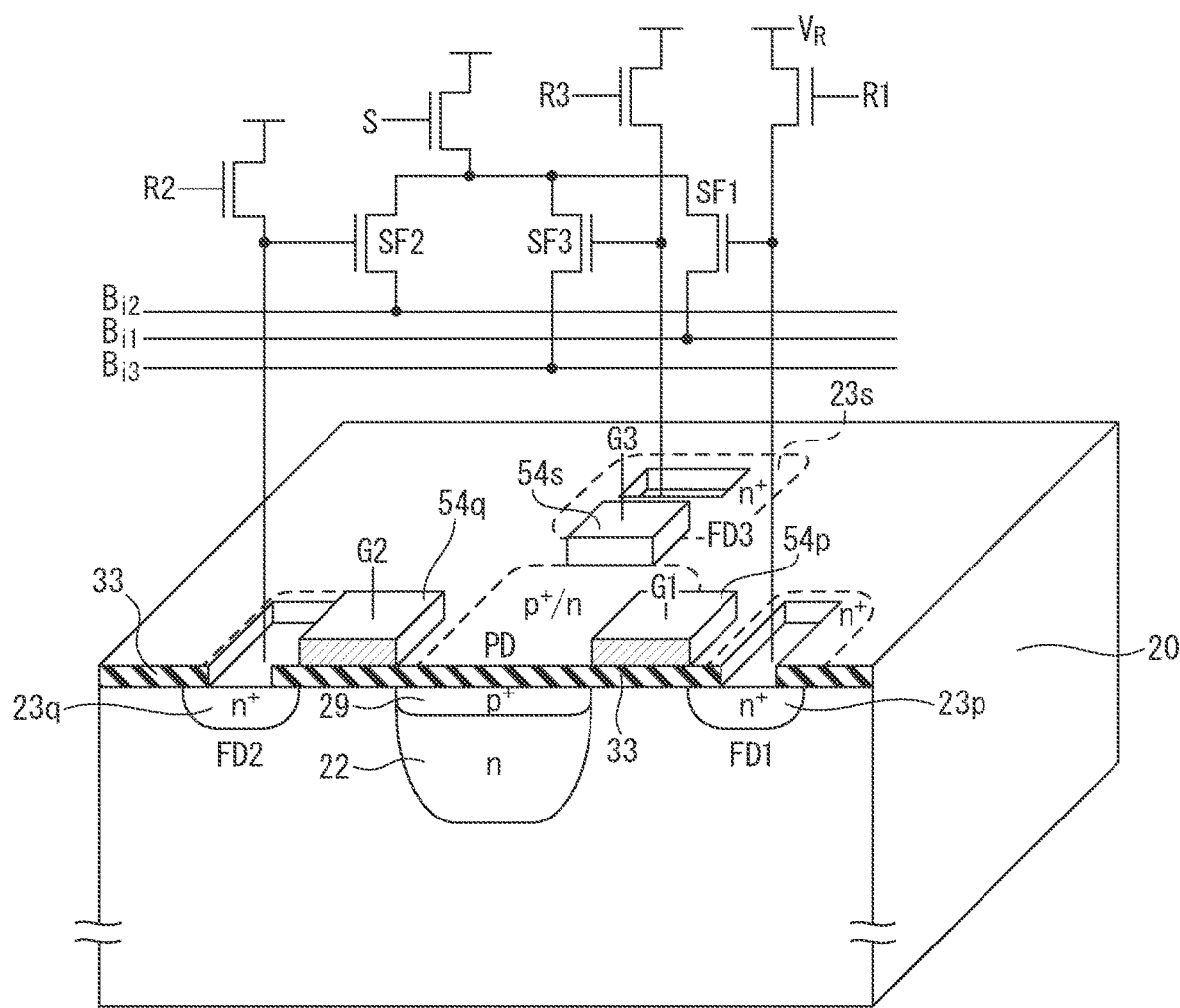
FIG. 23 is a cross-sectional view illustrating a structure of the range-measuring device pertaining to the variation of the fourth embodiment, focusing to a photoelectric-conversion transfer-unit of a pixel in the range-measuring device.

In this way, in the range-measuring device of the comparative example, when the target is far away, because the electrons scheduled to enter the second charge-accumulation region 23q have unintentionally entered into the first charge-accumulation region 23p scheduled at the next cycle, the range precision is made lower. However, according to the range-measuring device pertaining to the fourth embodiment, because the time intervals of the second charge-accumulation periods $T_{a2}$ can be made longer, by using the time-setting logical-circuit 741 in the control processor 74 illustrated in FIG. 2, the range precision is never made lower even when the target is far away, Variation of Fourth Embodiment FIG. 23 illustrates a cross-sectional view of a main portion of a pixel in a range-measuring device pertaining to a variation of the fourth embodiment. The main portion of the pixel illustrated in FIG. 23 is structured such that a third charge-distributing gate 54s (G₃) is connected to the light-receiving region of the photoelectric-conversion region (29, 22) in the main portion of the pixel illustrated in FIG. 21. A third charge-accumulation region 23s is connected to the third charge-distributing gate 54s, and a third auxiliary capacitor C3 that is not illustrated and a source-follower amplifying-transistor SF3 are connected through surface interconnections and others. Moreover, a first reset transistor R1, a second reset transistor R2 and a third reset transistor R3 are connected to the first charge-accumulation region 23p, the second charge-accumulation region 23q and the third charge-accumulation region 23s, respectively.

Figure 22A:
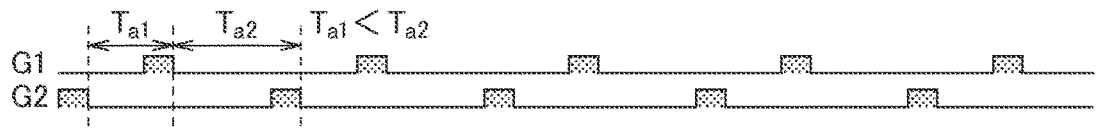
FIG. 22A is a drive-timing chart explaining another operation of the range-measuring device pertaining to the fourth embodiment, when the range-measuring device is adjusted.
Figure 22B:
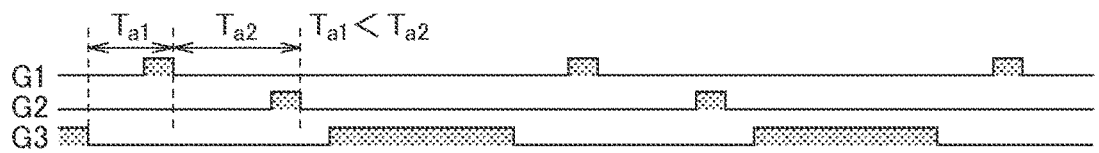
FIG. 22B is a drive-timing chart explaining an operation of a range-measuring device pertaining to a variation of the fourth embodiment, when the range-measuring device is adjusted, as compared with a drive-timing chart illustrated in FIG. 22A.

FIG. 22B is the timing chart illustrating a driving pulses of the range-measuring device pertaining to the variation of the fourth embodiment, and FIG. 22A is the timing chart illustrating the driving pulses of the range-measuring device pertaining to the fourth embodiment. The range-measuring device of the comparative example had a problem that the range precision was made lower when the target was far away. For improving the poor range precision in the comparative example, in the variation of the fourth embodiment, before a channel, or a charge-transfer route just under the third charge-distributing gate 54s is turned on, a channel, or a charge-transfer route of the third reset transistor R3 is turned on so that the charges can be exhausted to a power supply, which is connected to a reset drain region of the third reset transistor R3, without any accumulation of the charges in the third charge-accumulation region 23s. Thus, since the electrons scheduled to enter the second charge-accumulation region 23q never enter the first charge-accumulation region 23p of the next cycle, the range precision can be held in good condition.

Fifth Embodiment

FIG. 25 illustrates a plan view of a main portion of a pixel in a range-measuring device pertaining to a fifth embodiment. A first charge-accumulation region 23p, a second charge-accumulation region 23q, a third charge-accumulation region 23r, a fourth charge-accumulation region 23s, a first charge-exhaust region 23u and a second charge-exhaust region 23v are arranged separately from each other at six positions symmetric with respect to the central position of a photo gate (PG) 11, so as to surround the photo gate 11. "The photo gate 11" has a photoelectric converter with a MOS structure, in which a transparent electrode is used as a gate electrode. The first charge-accumulation region 23p serves as a first floating drain region FD1, the second charge-accumulation region 23q serves as a second floating drain region FD2, the third charge-accumulation region 23r serves as a third floating drain region FD3, the fourth charge-accumulation region 23s serves as a floating drain region FD4, and each of the first charge-exhaust region 23u and the second charge-exhaust region 23v is connected to a power supply VDD.

A first charge-distributing gate 33p (G1), a second charge-distributing gate 33q (G2), a third charge-distributing gate 33r (G3), a fourth charge-distributing gate 33s (G4), a first charge-exhausting gate 33u (GD) and a second charge-exhausting gate 33v (GD) are arranged so as to surround the periphery of the photo gate 11 as sextuple transfer-gate electrodes. An area of the photo gate 11 is defined by an opening, which is cut in a light shielding film for shielding the lights from entering, although the illustration of the shielding film is omitted. Each of the sextuple transfer-gate electrodes implements an insulated-gate transistor-mechanism.

Although illustration is omitted, gate insulating-films each of which implements the insulated-gate transistor-mechanism are arranged just under the first charge-distributing gate 33p, the second charge-distributing gate 33q, the third charge-distributing gate 33r, the fourth charge-distributing gate 33s, the first charge-exhausting gate 33u and the second charge-exhausting gate 33v. A first charge-accumulation region 23p, a second charge-accumulation region 23q, a third charge-accumulation region 23r, a fourth charge-accumulation region 23s, a first charge-exhaust region 23u and a second charge-exhaust region 23v is connected respectively as a drain region of each of the sextuple insulated-gate transistors. The sextuple insulated-gate transistors implement the sextuple charge-distributing gates, respectively.

A first auxiliary capacitor C1, a second auxiliary capacitor C2, a third auxiliary capacitor C3 and a fourth auxiliary capacitor C4, which are not illustrated, are connected through surface interconnections and others to the first charge-accumulation region 23p, the second charge-accumulation region 23q, the third charge-accumulation region 23r and the fourth charge-accumulation region 23s, respectively. Moreover, a first source-follower amplifying-transistor SF1, a second source-follower amplifying-transistor SF2, a third source-follower amplifying-transistor SF3 and a fourth source-follower amplifying-transistor SF4 are connected through surface interconnections and others to the first charge-accumulation region 23p, the second charge-accumulation region 23q, the third charge-accumulation region 23r and the fourth charge-accumulation region 23s, respectively. Each of the first charge-exhaust region 23u and the second charge-exhaust region 23v is connected through surface interconnections and others to the power supply.

When any one of the channels, or any one of the charge-transfer routes just under the first charge-distributing gate 33p, the second charge-distributing gate 33q, the third charge-distributing gate 33r and the fourth charge-distributing gate 33s is turned on, signal charges and others collected in the photo gate 11 are transported to a specific floating drain region connected to the specific charge-distributing gate, whose channel, or the charge-transfer route is turned on. On the other hand, when any one or both of the channels, or both of the charge-transfer routes just under the first charge-exhausting gate 33u and the second charge-exhausting gate 33v are turned on, unwanted charges and others generated by background lights, or environmental lights, are exhausted through the drain, or through the drains to the power supply.

Pulsed lights are scheduled to be emitted from the substantially same position as the imaging element illustrated in FIG. 25, and the reflected lights from the target 92 (please refer FIG. 1) is received by the imaging element. The received lights are incident on the imaging element, retarded by a delay time Ta from the instances when the projected lights are emitted, in accordance with the values of the ranges between the target 92 and the imaging element. When an optical projection time $T_o$ of the projected lights are made synchronous with on/off operations of voltage pulses applied to the first charge-distributing gate 33p, which is assigned to the first charge-accumulation region 23p, in response to pulses applied to the first charge-distributing gate 33p, the charge are accumulated in the first charge-accumulation region 23p. Similarly, when the optical projection time $T_o$ of the projected lights are made synchronous with on/off operations of voltage pulses applied to the second charge-distributing gate 33q, which is assigned to the second charge-accumulation region 23q, in response to pulses applied to the second charge-distributing gate 33q, the charge are accumulated in the second charge-accumulation region 23q. And, when the optical projection time $T_o$ of the projected lights are made synchronous with on/off operations of voltage pulses applied to the third charge-distributing gate 33r or the fourth charge-distributing gate 33s, which are assigned to the third charge-accumulation region 23r or the fourth charge-accumulation region 23s, in response to pulses applied to the third charge-distributing gate 33r or the fourth charge-distributing gate 33s, and the charge will be accumulated in the third charge-accumulation region 23r or the fourth charge-accumulation region 23s. Therefore, a difference is generated between the accumulated charge amounts in the first charge-accumulation region 23p, the second charge-accumulation region 23q, the third charge-accumulation region 23r and the fourth charge-accumulation region 23s, corresponding to the operations of the respective transfer-gate electrodes, on the basis of the delay time $T_d$ of the received light. Then, because the difference between the accumulated charge amounts in the first charge-accumulation region 23p, the second charge-accumulation region 23q, the third charge-accumulation region 23r and the fourth charge-accumulation region 23s is determined by the ranges defined between the range-measuring device and the target 92, it is possible to estimate ranges to the target 92.

However, actually, in addition to the delay time $T_d$ of the received lights that are generated in response to the range between the range-measuring device and the target 92, other delays are generated in received lights incident on the light-receiving region even in the inside of silicon. That is, due to the scattering and variation of the photo-electrically converting positions, broadening is generated in time domain, in which the signal charges by received lights are collected at different times in the photo gate 11. And therefore, the broadening in the time domain due to the scattering of the arrive times of the signal charges, which will arrive individually to the corresponding respective charge-accumulation regions through the quadruple charge-distributing gates, generates the additional delays, accordingly.

Figure 24A:
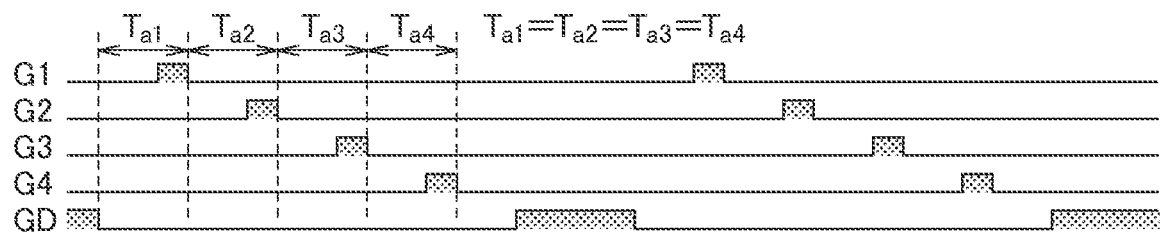
FIG. 24A is a drive-timing chart explaining an operation of the comparative example of technology, when the range-measuring device is adjusted.
Figure 24B:
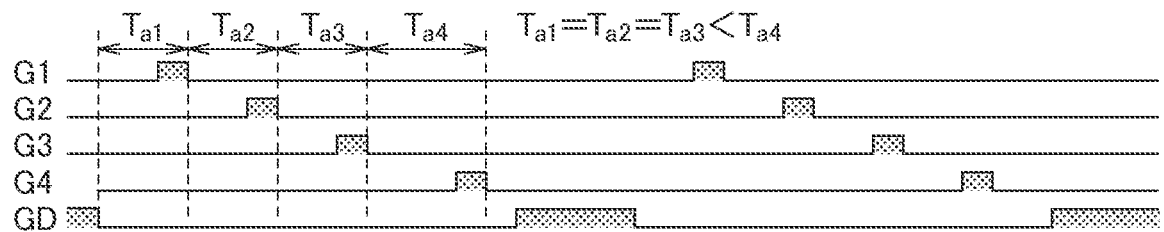
FIG. 24B is a drive-timing chart explaining an operation of the range-measuring device pertaining to the variation of the fourth embodiment, when the range-measuring device is adjusted, as compared with the drive-timing chart illustrated in FIG. 24A.

FIG. 24B is the timing chart illustrating the driving pulses of the range-measuring device pertaining to the fifth embodiment, and FIG. 24A is the timing chart illustrating the driving pulses of the range-measuring device of the comparative example. In earlier technology, the time intervals of the charge-accumulation periods were same. However, for suppressing the deterioration of the range precision, which is caused by the delayed signal charges and others, the charge-accumulation periods may be set to the time intervals differing from each other. Concretely, as illustrated in the timing chart in FIG. 24B, by using the time-setting logical-circuit 741 of the data memory 72 in FIG. 2, a fourth charge-accumulation period $T_{a4}$ assigned as a duration for charges to be accumulated in the fourth charge-accumulation region 23s may be made longer than each of the time intervals of the first charge-accumulation period $T_{a1}$ assigned as a duration for charges to be accumulated in the first charge-accumulation region 23p, the second charge-accumulation period $T_{a2}$ assigned as a duration for charges to be accumulated in the second charge-accumulation region 23q and the third charge-accumulation period $T_{a3}$ assigned as a duration for charges to be accumulated in the third charge-accumulation region 23r.

In the range-measuring devices pertaining to the first to fifth embodiments, the cases are described in which the number of the charge-distributing gates defining the transport routes of the signal charges, including unwanted charges generated by background light components or environmental light components, is three and four. However, similar discussions can be held even in a case that the number of the charge-distributing gates defining the transport routes of the signal charges, including the unwanted charges generated by background light components or environmental light components, is five or more. Typically, in a case of N charge-distributing gates in which N is a positive integer of three or more, for example, when a charge-accumulation period assigned to the N-th charge-distributing gate is made longer, it is possible to realize the effectiveness similar to those described in the range-measuring devices pertaining to the first to fifth embodiments.

Sixth Embodiment

Figure 26:
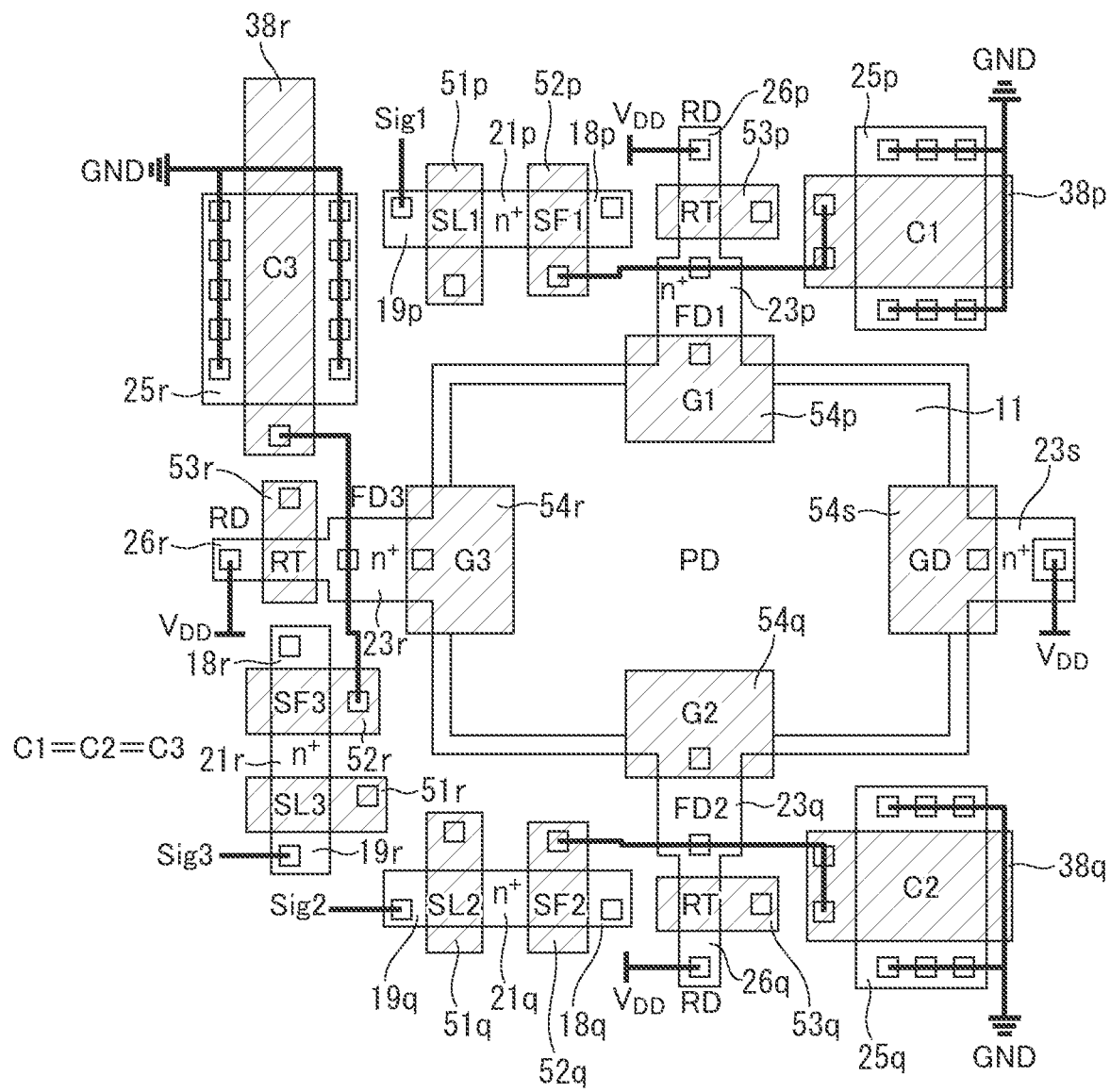
FIG. 26 is a layout of a main portion of a pixel in a range-measuring device pertaining to another comparative example of technology.
Figure 27:
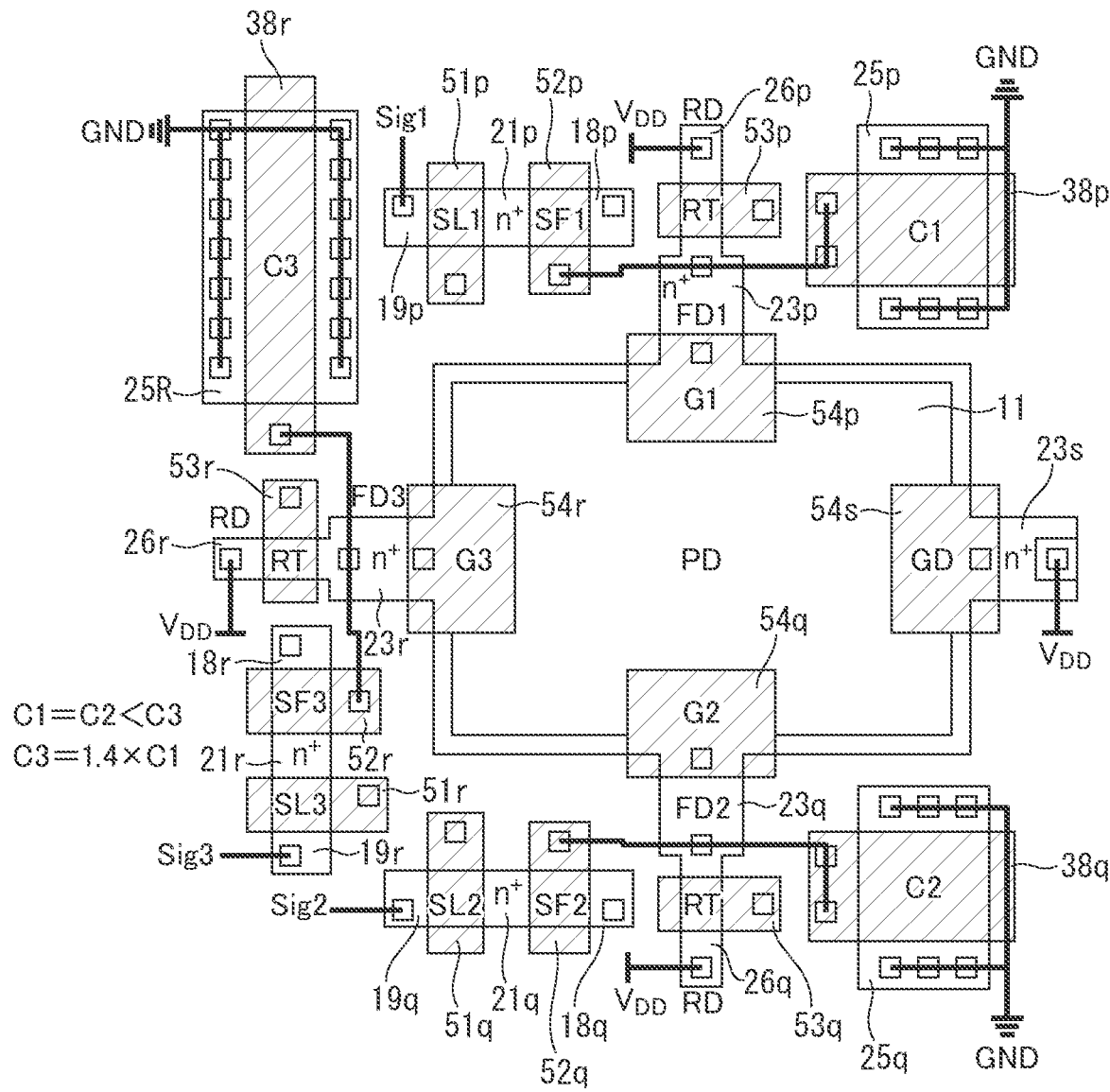
FIG. 27 is a layout of a main portion of a pixel in a range-measuring device pertaining to a sixth embodiment.

FIG. 27 illustrates a plan view of a main portion of a pixel in a range-measuring device pertaining to a sixth embodiment, and FIG. 26 illustrates a plan view of the main portion of the pixel in the range-measuring device of the comparative example. An n+ type first charge-accumulation region 23p serving as a first floating drain region FD1, an n+ type second charge-accumulation region 23q serving as a second floating drain region FD2, an n+ type third charge-accumulation region 23r serving as a third floating drain region FD3, and an n+ type charge-exhaust region 23s serving as an exhausting drain are arranged separately from each other at quadruple positions, which are symmetric with respect to the central position of a photo diode 11, respectively. The photo diode 11 has a photoelectric converter made of pn-junction.

A first charge-distributing gate 54p (G1), a second charge-distributing gate 54q (G2), a third charge-distributing gate 54r (G3) and a charge-exhausting gate 54s (GD), which implement quadruple charge-distributing gates, are arranged so as to surround the periphery of the photo diode 11. The asset and periphery of the photo diode 11 is defined by an opening, which is cut in a light shielding film (the illustration is omitted) provided for shielding lights around the photo diode 11. For each of the first charge-distributing gate 54p, the second charge-distributing gate 54q, the third charge-distributing gate 54r and the charge-exhausting gate 54s, a gate electrode is provided by a thin film of conductor, such as poly-crystalline silicon and others, so as to implement an insulated-gate transistor-mechanism.

Each of the first charge-accumulation region 23p, the second charge-accumulation region 23q, the third charge-accumulation region 23r and the charge-exhaust region 23s is connected to a drain region of the insulated-gate transistor, which implements each of the charge-distributing gates. A first auxiliary capacitor C1, a second auxiliary capacitor C2 and a third auxiliary capacitor C3 are connected through surface interconnection and others to the first charge-accumulation region 23p, the second charge-accumulation region 23q and the third charge-accumulation region 23r, respectively. The first auxiliary capacitor C1 illustrated on the upper right portion in FIGS. 26 and 27 may be a parallel plate capacitor encompassing an n+ type doped region 25p, a capacitor insulation film (whose illustration is omitted) laminated on the doped region 25p, and a first capacitor electrode 38p. The first capacitor electrode 38p may be a thin film of conductor such as poly-crystalline silicon and others, and the first capacitor electrode 38p is disposed on the capacitor insulation film.

Similarly, the second auxiliary capacitor C2 illustrated on the lower right portion in FIGS. 26 and 27 may be a parallel plate capacitor encompassing an n+ type doped region 25q, a capacitor insulation film (whose illustration is omitted) laminated on the doped region 25q, and a second capacitor electrode 38q made of a thin film of conductor such as poly-crystalline silicon and others, which is disposed on the capacitor insulation film. Also, the third auxiliary capacitor C3 illustrated on the upper left portion in FIG. 26 may be a parallel plate capacitor encompassing an n+ type doped region 25r, a capacitor insulation film (whose illustration is omitted) laminated on the doped region 25r, and a third capacitor electrode 38r made of a thin film of conductor such as poly-crystalline silicon and others, which is disposed on the capacitor insulation film.

On the other hand, the third auxiliary capacitor C3 illustrated on the upper left portion in FIG. 27 shall be a parallel plate capacitor encompassing an n" type doped region 25R that has a larger area than the doped region 25r in FIG. 26, a capacitor insulation film (whose illustration is omitted) laminated on the doped region 25R, and a third capacitor electrode 38r made of a thin film of conductor such as poly-crystalline silicon and others, which is disposed on the capacitor insulation film. Then, the capacitance of the third auxiliary capacitor C3 illustrated in FIG. 27 is about 1.4 times larger than the capacitance of the third auxiliary capacitor C3 illustrated in FIG. 26. By the way, in FIGS. 26 and 27, capacitances of the first auxiliary capacitor C1 and the second auxiliary capacitor C2 are set to be equal to each other. Namely, FIG. 26 is assumed as a capacitance of the first auxiliary capacitor C1=a capacitance of the second auxiliary capacitor C2=a capacitance of the third auxiliary capacitor C3. On the contrary, in FIG. 27, the capacitance of the third auxiliary capacitor C3 is about 1.4 times larger than the capacitance of the first auxiliary capacitor C1.

Each of sextuple open squares illustrated on the doped region 25p, the doped region 25q and the doped region 25r schematically indicates a contact hole. Each of the doped region 25p, the doped region 25q and the doped region 25r is connected to a ground potential (GND) through surface interconnections extending to the contact holes.

Moreover, a first reset transistor RT having a first gate electrode 53p, a second reset transistor RT having a second gate electrode 53q and a third reset transistor RT having a third gate electrode 53r encompass the first charge-accumulation region 23p, the second charge-accumulation region 23q and the third charge-accumulation region 23r, as respective source regions. Each of the first gate electrode 53p, the second gate electrode 53q and the third gate electrode 53r can be made of a thin film of conductor such as poly-crystalline silicon and others. The first reset transistor RT has a first reset drain (RD) region 26p opposite to the first charge-accumulation region 23p through the first gate electrode 53p. The second reset transistor RT has a second reset drain (RD) region 26q opposite to the second charge-accumulation region 23q through the second gate electrode 53q. The third reset transistor RT has a third reset drain (RD) region 26r opposite to the third charge-accumulation region 23r through the third gate electrode 53r.

One open square indicated on each of the first reset drain region 26p, the second reset drain region 26q and the third reset drain region 26r schematically indicates a contact hole. Each of the first reset drain region 26p, the second reset drain region 26q and the third reset drain region 26r is connected to the power supply (VDD), through surface interconnections extending to the contact holes.

Moreover, open squares indicated on each of the first charge-accumulation region 23p, the second charge-accumulation region 23q and the third charge-accumulation region 23r schematically indicates contact holes. Through surface interconnections extending to the contact holes, each of the first charge-accumulation region 23p, the second charge-accumulation region 23q and the third charge-accumulation region 23r is connected to each of a first amplifying gate electrode 52p of the first source-follower amplifying-transistor SF1, a second amplifying gate electrode 52q of the second source-follower amplifying-transistor SF2 and a third amplifying gate electrode 52r of the third source-follower amplifying-transistor SF3. The fourth charge-accumulation region 23s is connected to the power supply (VDD) through a surface interconnection running on a contact hole of fourth charge-accumulation region 23s, the contact hole is schematically indicated by an open square in the fourth charge-accumulation region 23s.

Also, through other surface interconnections extending on contact holes of the first charge-accumulation region 23p, the second charge-accumulation region 23q and the third charge-accumulation region 23r, each of the first charge-accumulation region 23p, the second charge-accumulation region 23q and the third charge-accumulation region 23r is connected to the first capacitor electrode 38p of the first auxiliary capacitor C1, the second capacitor electrode 38q of the second auxiliary capacitor C2 and the third capacitor electrode 38r of the third auxiliary capacitor C3, respectively.

Each of a first amplifying-drain region 18p of the first source-follower amplifying-transistor SF1, a second amplifying-drain region 18q of the second source-follower amplifying-transistor SF2 and a third amplifying-drain region 18r of the third source-follower amplifying-transistor SF3 is connected to a power supply VDD whose illustration is omitted. A first amplifying-source region 21p of the first source-follower amplifying-transistor SF1 is connected as a common region to a first drain electrode of a first select transistor SL1 for pixel selection. Similarly, a second amplifying-source region 21q of the second source-follower amplifying-transistor SF2 is connected as a common region to a second drain electrode of the second select transistor SL2 for pixel selection, and a third amplifying-source region 21r of the third source-follower amplifying-transistor SF3 is connected as a common region to a third drain electrode of the third select transistor SL3 for pixel selection.

As illustrated in FIGS. 26 and 27, a first select-source region 19p of the first select transistor SL1 is connected to a first vertical-output signal-line Sig1 through the contact hole schematically indicated by an open square. And, a horizontal-line selection control-signal S is applied to a first select-gate electrode 51p of the first select transistor SL1, from the vertical shift register/vertical scanner 95 illustrated in FIG. 1. Similarly, a second select-source region 19q of the second select transistor SL2 is connected to a second vertical-output signal-line Sig2 through the contact hole schematically indicated by an open square. Then, the horizontal-line selection control-signal S is applied to a second select-gate electrode 51q of the second select transistor SL2, from the vertical shift register/vertical scanner 95. Moreover, a third select-source region 19r of the third select transistor SL3 is connected to a third vertical-output signal-line Sig3 through the contact hole schematically indicated by an open square, and the horizontal-line selection control-signal S is applied to a third select-gate electrode 51r of the third select transistor SL3, from the vertical shift register/vertical scanner 95.

By setting the select-control signal S to a high level, the select transistors SL1, SL2 and SL3 are turned on. And therefore, the first vertical-output signal-line Sig1, the second vertical-output signal-line Sig2 and the third vertical-output signal-line Sig3 are accordingly set to respective voltages corresponding to potential levels of the first charge-accumulation region 23p, the second charge-accumulation region 23q and the third charge-accumulation region 23r, each of the potential levels is amplified by the source-follower amplifying-transistors SF1, SF2 and SF3, respectively.

As already described, an incremental difference between the planar layouts illustrated in FIGS. 26 and 27 lies in the following technical features. That is, although in the comparative example illustrated in FIG. 26, it is assumed that the capacitance of the first auxiliary capacitor C1=the capacitance of the second auxiliary capacitor C2=the capacitance of the third auxiliary capacitor C3, in the range-measuring device pertaining to the sixth embodiment illustrated in FIG. 27, it is assumed that the capacitance of the third auxiliary capacitor C3>the capacitance of the first auxiliary capacitor C1=the capacitance of the second auxiliary capacitor C2. In the range-measuring devices pertaining to the first to fifth embodiments, the examples are explained in which the time interval of the finally assigned charge-accumulation period is made longer among the charge-accumulation periods assigned to the plurality of charge-distributing gates. Then, owing to the unwanted charges ascribable to environmental lights, the sum of the charge-accumulation amounts, which are accumulated in the charge-accumulation region and the auxiliary capacitor, becomes larger, wherein the charge-accumulation region is connected to the final charge-distributing gate, of which the charge-accumulation period is made longer.

Ascribing to the increase of the sum of the accumulated amounts of charges, which are accumulated in the charge-accumulation region and the auxiliary capacitor, occurrences of the situations, in which the saturation of the charges in the pixels of the range-measuring devices are determined by the sum of the accumulated amounts, will increase. In the sum of the accumulated amounts of charges, the charges shall be accumulated in the charge-accumulation region connected to the charge-distributing gate, corresponding to the finally assigned charge-accumulation period. As a countermeasure against the problem of the charge saturations in the pixels, it is enough to pre-design the pixels such that the sum of the capacitances of the charge-accumulation region connected to the charge-distributing gate assigned to the finally allocated charge-accumulation period and the auxiliary capacitor larger than the sum of the capacitances of the charge-accumulation region connected to a different charge-distributing gate and the auxiliary capacitor.

Because changing the design of the capacitance of the auxiliary capacitor is easier than changing the capacitance of the charges in the charge-accumulation region, it is enough to increase the capacitance of the auxiliary capacitor. Although FIG. 27 has exemplified the case in which the third auxiliary capacitor C3 was 1.4 times larger than each of the first auxiliary capacitor C1 and the second auxiliary capacitor C2, because the magnification is not limited to 1.4 times, a desirable capacitance value may be properly selected in view of the values of the unwanted charges generated by environmental lights and the like.

Other Embodiments

As mentioned above, the present invention has been described on the basis of the first to sixth embodiments. However, the descriptions and drawings that implement a part of the disclosure should not be understood to limit the technical scope of the present invention. From the disclosure, the miscellaneous variations of the embodiments, configurations and operational techniques may be clearly understood by one skilled in the art. For example, in the explanation of the first to sixth embodiments as described already, the first conductivity type is explained as the p-type, and the second conductivity type is explained as the n-type. However, even if the first conductivity type is assumed to be defined as the n-type and the second conductivity type is assumed to be the p-type, the similar effectiveness may be understood to be achieved, when the electrical polarities are set opposite to each other.

In the explanation of the range-measuring device pertaining to the first embodiment of the present invention, the example in which "the charge-distributing gate" of the present invention is implemented by the set of lateral EFC electrode pairs, which is called "the lateral electric field charge modulator (LEFM)", has been explained by using FIG. 3. And, also, in the range-measuring devices pertaining to the fourth to sixth embodiments of the present invention, the cases have been exemplified in which the structures of the charge-distributing gates are the gate electrodes in MOS architecture or MIS architecture. However, the structure of the charge-distributing gates and the charge-exhaust electrodes are not limited to the LEFM architecture or the electrode structures of the insulated-gate transistors, which have been exemplified in the first to sixth embodiments. Any configuration is allowed for the charge-distributing gates and the charge-exhaust electrodes, as far as the similar function that can send or transfer the signal charges can be achieved. And, in the descriptions in the first to fourth embodiments and the sixth embodiment, the photoelectric converter has been explained by using the light-receiving region implementing the photodiode of pn-junction structure, and in the description of the fifth embodiment, the photoelectric converter has been explained by the photogate structure, which uses the MOS structure encompassing the transparent electrode as the gate electrode. However, because the photoelectric converter is not limited to the structure of the photodiode or the photo gate, and any configuration is allowed for the photoelectric converter, as far as the similar photoelectric conversion functions can be achieved.

In this way, naturally, the present invention includes various embodiments and the like that are not described here. Thus, the technical scopes of the present invention should be determined only by the technical features specifying the invention prescribed by following Claims, conceivable and reasonable from the above explanations.

INDUSTRIAL APPLICABILITY

Figure 28:
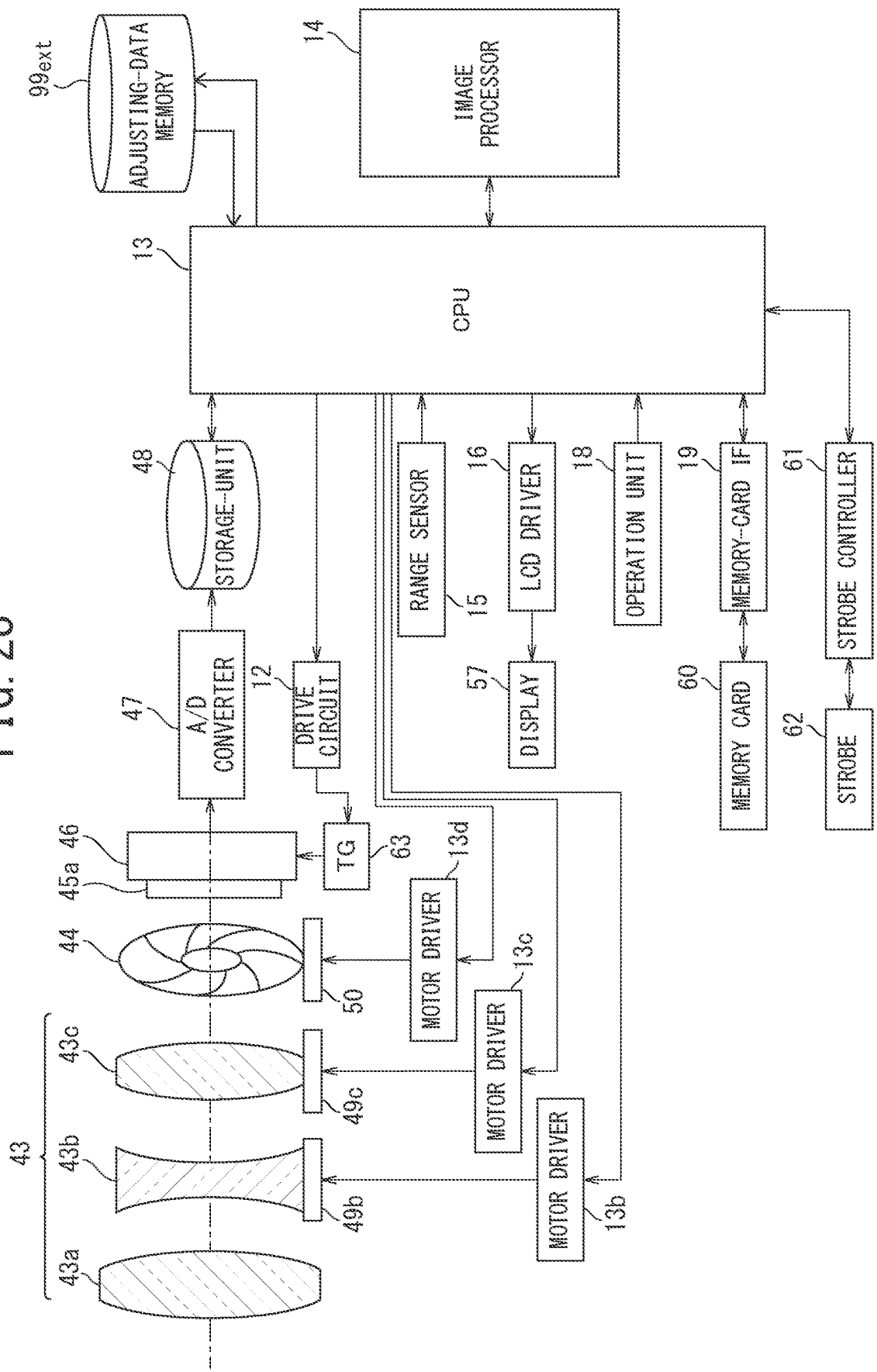
FIG. 28 is a block diagram explaining an outline of a structure of a camera, serving as one example in application fields of the range-measuring devices pertaining to the first to sixth embodiments of the present invention.

The range-measuring device pertaining to the first to sixth embodiments of the present invention can be used as a 3D imaging device in a technical field of a camera as illustrated in FIG. 28, for example. As exemplified in FIG. 28, the camera such as a video camera, which has the applicability of the technical field of the present invention, may include a single set of imaging-optical tool (43, 44) and a 3D imaging device 45a, which implements the main portion of the range-measuring devices pertaining to the first to sixth embodiments. The 3D imaging device 45a obtains the image of the target 92 (please refer FIG. 1) incident along the optical axis of the single set of imaging-optical tool (43, 44). Furthermore, the camera illustrated in FIG. 28 encompasses a range sensor (range-measuring element) 15, which is adapted for autofocus (AF), implemented by the range-measuring devices pertaining to the first to sixth embodiments.

The camera having an industrial applicability of the present invention may include an A/D converter 47 for converting an image data, which is transmitted from the 3D imaging device 45a implementing the main portion of the range-measuring device pertaining to each of the first to sixth embodiments, into a digital data, a memory (semiconductor storage) 48 for storing the image data which is converted into the digital data by the A/D converter 47, a control unit (CPU) 13 for receiving the image data from the memory 48, and an image processor 14 for receiving the image data through the control unit 13 and processing the image data. And, the 3D imaging device 45a and an adjusting-data memory $99_{ext}$ for storing an adjustment data of the range sensor (range-measuring element) 15 are connected to the image processor 14 so that it is possible to perform the adjustments of the drives in accordance with the flowcharts exemplified in FIGS. 5, 8, 15 and 18.

By the way, because FIG. 28 is merely the exemplification, any other structure may be used, in which the adjusting-data memory for storing the adjustment data transmitted from the control unit 13 is merged on the semiconductor chip including the 3D imaging device 45a or range sensor (range-measuring device), such that the adjustment data is transmitted to the driver on the semiconductor chip. The camera with the industrial applicability of the present invention can further include a drive-circuit 12 connected to the control unit 13, a memory-card interface 59 such as a media controller or the like, an operation unit 18, a liquid crystal display (LCD) driver 16, motor drivers 13b, 13c and 13d, and a strobe controller 61. A display 57 composed of LCD is connected to the LCD driver 16, and a strobe 62 is connected to the strobe controller 61. The strobe 62 can serve as the light emitter 91 illustrated in FIG. 1.

The control-unit 13 of the camera exemplified in FIG. 28 delivers various instructions and miscellaneous electric signals for controlling the respective operations and processes of the image processor 14, the drive-circuit 12, the memory 48, the memory-card interface 19, the operation unit 18, the LCD driver 16, the range sensor (range-measuring element) 15, the motor drivers 13b, 13c and 13d and the strobe controller, which are connected to the control unit 13. Although illustration is omitted, various logical circuits, such as a white balance (WB) adjustment-instruction output-circuit for performing an auto white balance (AWB) adjustment are assembled as logical hardware resources in the control-unit 53. Furthermore, various instruction output-circuit for instructing the operations of each of the image processor 14, the drive-circuit 12, the memory 48, the memory-card interface 19, the operation unit 18, the LCD driver 16, the range sensor (range-measuring element) 15, the motor drivers 13b, 13c and 13d and the strobe controller, are also assembled as logical hardware resources in the control unit 13.

As illustrated in FIG. 28, an imaging lens 43 implementing the imaging-optical tool (43, 44) can include, for example, a main lens 43a, a zoom lens 43b adjacent to the main lens 43a, a focus lens 43c adjacent to the zoom lens 43b and others. In the structure exemplified in FIG. 28, a zoom motor 49b is connected to the zoom lens 43b, and a focus motor 49c is connected to the focus lens 43c. A throttling device 44 implementing the imaging-optical tool (43, 44) is arranged between the focus lens 43c and the 3D imaging device 45a. For example, to the throttling device 44 composed of quintuple throttling vanes, an iris motor 50 for driving the throttling vanes is connected. The zoom motor 49b, the focus motor 49c and the iris motor 50 may be implemented by stepping motors, and the zoom motor 49b, the focus motor 49c and the iris motor 50 are operationally controlled by drive pulses transmitted from the motor drivers 13b, 13c and 13d connected to the control unit 13. Then, an imaging preparation process is carried out by signals from the operation unit 18 such as a release button and the like.

The zoom motor 49b drives the zoom lens 43b to "a wide-side" or "tele-side", for example, at 20 to 50 stages or the like, and zooms the imaging lens 43. The focus motor 49c moves the focus lens 43c in accordance with the values of the ranges from the target 92 or a variable power of the zoom lens 43b. And, the focus motor 49c adjusts a focus of the imaging lens 43 so that the imaging condition of the camera becomes optimal. The iris motor 50 changes an open area of the throttling device 44 by operating the throttling vanes of the throttling device 44, and properly adjusts the exposure of the imaging lens 43 to a desirable throttling value.

The imaging lens 43 is not limited to the configuration exemplified in FIG. 28. For example, the imaging lens 43 may be an interchangeable lens that can be attached to and detached from the camera. Since the imaging lens 43 is implemented by a plurality of optical lens groups, such as the main lens 43a, the zoom lens 43b, the focus lens 43c and others, the image of luminous flux from the target 92 is focused on the surface of the 3D imaging device 45a arranged at the vicinity of the focal plane of the luminous flux.

The 3D imaging device 45a implementing the main portion of the range-measuring device of each of the first to sixth embodiments is assembled on a chip-mounting substrate (package substrate) 46 made of glass and ceramic. A timing generator (TG) 63 is connected to the 3D imaging device 45a, and the timing generator 63 is connected through the drive-circuit 12 to the control unit 13. Signals transmitted through the drive-circuit 12 from the control unit 13 causes the timing generator 63 to generate a timing signals (clock pulses), and the timing signals are sent through the chip-mounting substrate 46 to the pixel on each row, as signals for an electronic shutter from a driver arranged as a peripheral circuit on a semiconductor chip implementing the 3D imaging device 45a.

That is, the control unit 13 controls the timing generator 63 through the drive-circuit 12. And, the control unit 13 controls a shuttering speed of the electronic shutter in the 3D imaging device 45a. By the way, the timing generator 63 may be monolithically integrated as a peripheral circuit on the semiconductor chip implementing the 3D imaging device 45a.

Imaging signals transmitted from the pixel-array area at the center of the semiconductor chip implementing the 3D imaging device 45a are entered to correlated double sampling circuits (CDSs) formed as the peripheral circuit of the periphery of the semiconductor chip. Then, the imaging signals are transmitted from the 3D imaging device 45a as the image data of R, G and B that accurately corresponds to the accumulated charge amounts of each pixel in the 3D imaging device 45a. The image data transmitted from the 3D imaging device 45a is amplified by an amplifier whose illustration is omitted. And the image data is converted into a digital data by the A/D converter 47. The 3D imaging device 45a converts an image of the target 92, which is timing-controlled by the drive-circuit 12 and imaged on a light-receiving plane in the 3D imaging device 45a. Then, the image of the target 92 is converted into image signals, and the image signals are transmitted to the A/D converter 47.

Although illustration is omitted, the image processor 14 of the camera exemplified in FIG. 28 can include a WB control-amount calculator for calculating a WB control-amount that is used for white balance adjustment, a logical calculator for automatic exposure (AE) detection, which integrates G signals of the entire screen or integrates G signals in which different weight settings are performed on the center and periphery of the screen and transmits its integrated value, an imaged Ev value calculator for calculating a brightness (imaged Ev value) of the target 92 necessary for the AE from the integration value delivered by the logical calculator for AE detection, and various logical circuits (hardware, modules) for performing various imaging processes and operations associated with the image processes, on the image data, such as a gradation conversion processor, a white balance compensation processor and a gamma compensation processor, as hardware resources on logical structure.

The image processor 14 pertaining to the first embodiment can be realized if there is an image-processing engine and the like. Also, when an operational load is high for feature amount generation and identifying process, the image processor 14 may be assembled in any of hardware resources. For example, it is possible to implement the image processor 14 in a computer system by using MPUs, which are assembled as microchips. Also, as the image processor 14 implementing the computer system, it is possible to use DSP specialized for signal processing, in which an arithmetic operating function is strengthened, or to use a microcomputer whose purpose is to control an installed device by including memories and peripheral circuits. Or alternatively, the main CPU of a current general-purposed computer may be used in the image processor 14. Moreover, the partial configuration or entire configuration of the image processor 14 may be implemented by PLD such as FPGA.

What is claimed is:

1. A range-measuring device comprising:
   a light emitter for projecting pulsed lights to a target;
   a light-receiving region for receiving reflected pulsed lights from the target, configured to photo-electrically convert the received pulsed lights into signal charges in the light-receiving region;
   a set of N charge-distributing gates, configured to distribute the signal charges toward N charge-transfer routes, in sequence, so that the signal charges can transport along the N charge-transfer routes, respectively, wherein "N" is a positive integer of three or more;
   a charge-exhausting gate for exhausting unwanted charges other than the signal charges from the light-receiving region, the unwanted charges are generated in the light-receiving region;
   N charge-accumulation regions for accumulating the signal charges transported along the N charge-distributing gates, respectively;
   a driver for transmitting a sequential set of control signals to the light emitter and transmitting drive signals in sequence to each of the N charge-distributing gates and the charge-exhausting gate at sequential timings differing from each other so as to provide offset times in between the sequential set of the drive signals;
   a readout-amplifier for independently reading out output signals corresponding to each of the signal charges accumulated in the N charge-accumulation regions, respectively; and an arithmetic logic circuit configured to execute a job-jobs of K times for calculating sequentially ranges to the target, after receiving the output signals transmitted through the readout-amplifier, wherein "K" is a positive integer of three or more; and a control processor configured to generate the drive signals for sequentially extending (K−1) times of charge-accumulation periods, which are assigned to a particular charge-distributing gate among the N charge-distributing gates, for executing the jobs of K times, respectively, using values of signals delivered from the arithmetic logic circuit, and transmits the drive signals to the driver.

2. The range-measuring device of claim 1, further comprising a control processor configured to generate N drive signals assigned to the N charge-distributing gates, respectively, each of the N drive signals having a different value of charge-accumulation period from each other, and to transmit the N drive signals to the driver.

3. The range-measuring device of claim 1, wherein the particular charge-distributing gate is a charge-distributing gate assigned to a finally allocated charge-accumulation period in a time sequence of a repetitive cycle period, the repetitive cycle period is defined by a repetitive cycle of the drive signals applied to the charge-exhausting gate.

4. The range-measuring device of claim 1, wherein the control processor judges whether or not incremental differences between the unwanted charges corresponding to the dark condition, which are measured and calculated by the arithmetic logic circuit at period between a L-th job and a (L−1)th job and at a period between the (L−1)th job and a (L−2)th job, is lower than a predetermined threshold, and further enlarges a finally allocated charge-accumulation period assigned to the particular charge-distributing gate, if the incremental difference is not lowered than the threshold, and ends an extending operation if the incremental difference is lower than the threshold, wherein "L" is a positive integer equal to or smaller than "K".

5. The range-measuring device of claim 1, wherein the control processor judges whether or not an incremental differences between detected values of ranges, which are measured and calculated by the arithmetic logic circuit at a period between a L-th job and a (L−1)th job and at a period between the (L−1)th job and a (L−2)th job, is lower than a predetermined threshold, and further enlarges a finally allocated charge-accumulation period assigned to the particular charge-distributing gate if the incremental difference is not lowered than the threshold, and ends an extending operation if the incremental difference is lower than the threshold, wherein "L" is a positive integer equal to or smaller than "K".

6. The range-measuring device of claim 1, wherein auxiliary capacitors are arranged in each of the N charge-accumulation regions.

7. The range-measuring device of claim 1, wherein auxiliary capacitors are arranged in each of the N charge-accumulation regions.

8. The range-measuring device of claim 3, wherein auxiliary capacitors are arranged in each of the N charge-accumulation regions.

9. The range-measuring device of claim 7, wherein a capacitance of the auxiliary capacitor connected to the charge-accumulation region for accumulating the signal charges from the particular charge-distributing gate is larger than the capacitance of the other auxiliary capacitors, respectively.

10. A camera comprising:
an imaging-optical tool;
a light emitter for projecting pulsed lights to a target;
a solid-state imaging device merging:
 a light-receiving region for receiving reflected pulsed lights from the target through the imaging-optical tool, configured to photo-electrically convert the received pulsed lights into signal charges in the light-receiving region,
 a set of N charge-distributing gates configured to distribute the signal charges toward N charge-transfer routes, in sequence, so that the signal charges can transport along the N charge-transfer routes, respectively, wherein "N" is a positive integer of three or more,
 a charge-exhausting gate for exhausting unwanted charges other than the signal charges from the light-receiving region, the unwanted charges are generated in the light-receiving region,
 N charge-accumulation regions for accumulating the signal charges transported along the N charge-distributing gates, respectively,
a driver for transmitting a sequential set of control signals to the light emitter and transmitting drive signals in sequence to each of the N charge-distributing gates and the charge-exhausting gate at sequential timings differing from each other so as to provide offset times in between the sequential set of the drive signals, and
a readout-amplifier for independently reading out output signals corresponding to each of the signal charges accumulated in the N charge-accumulation regions, respectively; and
an arithmetic logic circuit configured to execute jobs of K times for calculating sequentially ranges to the target, after receiving the output signals transmitted through the readout-amplifier, wherein "K" is a positive integer of three or more; and
a control processor configured to generate the drive signals for sequentially extending (K−1) times of charge-accumulation periods, which are assigned to a particular charge-distributing gate among the N charge-distributing gates, for executing the jobs of K times, respectively, using values of signals delivered from the arithmetic logic circuit, and transmits the drive signals to the driver.

11. The camera of claim 10, further comprising a control processor configured to generate N drive signals assigned to the N charge-distributing gates, respectively, each of the N drive signals having a different value of charge-accumulation period from each other, and to transmit the N drive signals to the driver.

12. The range-measuring device of claim 10, wherein the control processor judges whether or not incremental differences between the unwanted charges corresponding to the dark condition, which are measured and calculated by the arithmetic logic circuit at period between a L-th job and a (L−1)th job and at a period between the (L−1)th job and a (L−2)th job, is lower than a predetermined threshold, and further enlarges the finally allocated charge-accumulation period assigned to the particular charge-distributing gate, if the incremental difference is not lowered than the threshold, and ends the extending operation if the incremental difference is lower than the threshold, wherein "L" is a positive integer equal to or smaller than "K".

13. A drive-adjusting method of a range-measuring device including a light emitter for projecting pulsed lights to a target; a light-receiving region for receiving reflected pulsed lights from the target, configured to photo-electrically convert the received pulsed lights into signal charges in the light-receiving region; a set of N charge-distributing gates, configured to distribute the signal charges toward N charge-transfer routes, in sequence, so that the signal charges can transport along the N charge-transfer routes, respectively, wherein "N" is a positive integer of three or more; a charge-exhausting gate for exhausting unwanted charges other than the signal charges from the light-receiving region, the unwanted charges are generated in the light-receiving region; N charge-accumulation regions for accumulating the signal charges transported along the N charge-distributing gates, respectively; a driver for transmitting control signals to the light emitter and transmitting drive signals in sequence to each of the N charge-distributing gates and the charge-exhausting gate; and a readout-amplifier for independently reading out output signals corresponding to each of the signal charges accumulated in the N charge-accumulation regions, respectively, the drive-adjusting method including:

executing jobs of K times for calculating sequentially ranges to the target, after receiving the signals transmitted through the readout-amplifier, wherein "K" is a positive integer of three or more; and generating sequential set of the drive signals, configured to be transmitted to each of the N charge-distributing gates and the charge-exhausting gate, at sequential timings differing from each other so as to provide offset times in between the sequential set of the drive signals.

14. The drive-adjusting method of claim 13, wherein the step of generating sequential set of the drive signals comprises: sequentially extending (K−1) times of charge-accumulation periods assigned to a particular charge-distributing gate among the N charge-distributing gates for executing the jobs of K times, respectively; and transmitting the drive signals to the driver.

15. The drive-adjusting method of claim 13, further including a step of generating N drive signals assigned to the N charge-distributing gates, respectively, each of the N drive signals having a different value of charge-accumulation period from each other, and transmitting the N drive signals to the driver.

16. The drive-adjusting method of claim 14, wherein the particular charge-distributing gate is a charge-distributing gate assigned to a finally allocated charge-accumulation period in a time sequence of a repetitive cycle period, the repetitive cycle period is defined by a repetitive cycle of the drive signals applied to the charge-exhausting gate.

17. The drive-adjusting method of claim 14, wherein the step of generating sequential set of the drive signals comprises:

judging whether or not incremental differences between charges corresponding to dark condition, which are measured and calculated at period between a L-th job and a (L−1)th job and at a period between the (L−1)th job and a (L−2)th job, is lower than a predetermined threshold, wherein "L" is a positive integer equal to or smaller than "K";

further enlarging a finally allocated charge-accumulation period assigned to the particular charge-distributing gate, if the incremental difference is not lowered than the threshold; and ending an extending operation if the incremental difference is lower than the threshold.

18. The range-measuring device of claim 14, wherein the step of generating sequential set of the drive signals comprises:

judging whether or not incremental differences between detected values of ranges, which are measured and calculated at period between a L-th job and a (L−1)th job and at a period between the (L−1)th job and a (L−2)th job, is lower than a predetermined threshold, wherein "L" is a positive integer equal to or smaller than "K";

further enlarging a finally allocated charge-accumulation period assigned to the particular charge-distributing gate if the incremental difference is not lowered than the threshold; and ending an extending operation if the incremental difference is lower than the threshold.

\* \* \* \* \*